(12) United States Patent
Egoshi et al.

(10) Patent No.: US 8,637,892 B2
(45) Date of Patent: Jan. 28, 2014

(54) LED PACKAGE AND METHOD FOR MANUFACTURING SAME

(75) Inventors: Hidenori Egoshi, Fukuoka-ken (JP);
Hiroaki Oshio, Fukuoka-ken (JP);
Teruo Takeuchi, Fukuoka-ken (JP);
Kazuhiro Inoue, Fukuoka-ken (JP);
Iwao Matsumoto, Fukuoka-ken (JP);
Satoshi Shimizu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 382 days.

(21) Appl. No.: 12/886,890

(22) Filed: Sep. 21, 2010

(65) Prior Publication Data

US 2011/0186902 A1    Aug. 4, 2011

(30) Foreign Application Priority Data

Jan. 29, 2010  (JP) ................................ 2010-019782
Aug. 23, 2010  (JP) ................................ 2010-186505

(51) Int. Cl.
*H01L 33/00* (2010.01)
(52) U.S. Cl.
USPC ............... 257/99; 257/98; 257/676; 257/677; 257/E33.056; 257/E33.066
(58) Field of Classification Search
USPC ............. 257/98, 99, 676, 677, 690, E33.056, 257/E33.066
See application file for complete search history.

(56) References Cited

U.S. PATENT DOCUMENTS

| | | | |
|---|---|---|---|
| 5,798,536 A * | 8/1998 | Tsutsui ........................... | 257/99 |
| 6,066,861 A * | 5/2000 | Hohn et al. ..................... | 257/99 |
| 6,245,259 B1 * | 6/2001 | Hohn et al. ............. | 252/301.36 |
| 6,888,231 B2 | 5/2005 | Maeda | |
| 8,258,697 B2 * | 9/2012 | Muranaka et al. ............ | 313/512 |
| 2002/0004251 A1 * | 1/2002 | Roberts et al. .................. | 438/26 |
| 2004/0140764 A1 * | 7/2004 | Lin et al. ....................... | 313/512 |
| 2004/0188697 A1 * | 9/2004 | Brunner et al. ................. | 257/99 |

(Continued)

FOREIGN PATENT DOCUMENTS

| | | |
|---|---|---|
| JP | 2003110080 | 4/2003 |
| JP | 2003110145 | 4/2003 |

(Continued)

OTHER PUBLICATIONS

Chinese Office Action for Chinese Application No. 201110032319.9 mailed on Jan. 17, 2013.

(Continued)

*Primary Examiner* — Jarrett Stark
(74) *Attorney, Agent, or Firm* — White & Case LLP

(57) ABSTRACT

According to one embodiment, an LED package includes first and second lead frames, an LED chip and a resin body. The first and second lead frames are apart from each other. The LED chip is provided above the first and second lead frames, the LED chip includes a semiconductor layer which contains at least indium, gallium and aluminum, one terminal of the LED chip is connected to the first lead frame, and another terminal of the LED chip is connected to the second lead frame. The resin body covers the LED chip and an entire upper surface, a part of a lower surface, and parts of edge surfaces of each of the first and second lead frames, and the resin body exposes a rest of the lower surface and a rest of the edge surfaces. And, an appearance of the resin body is a part of an appearance of the LED package.

8 Claims, 18 Drawing Sheets

(56) References Cited

U.S. PATENT DOCUMENTS

| | | | | |
|---|---|---|---|---|
| 2004/0227151 A1* | 11/2004 | Konno et al. | | 257/103 |
| 2005/0156187 A1* | 7/2005 | Isokawa et al. | | 257/100 |
| 2007/0131957 A1* | 6/2007 | Brunner et al. | | 257/99 |
| 2008/0012036 A1* | 1/2008 | Loh et al. | | 257/99 |
| 2010/0163920 A1* | 7/2010 | Itai | | 257/99 |
| 2010/0327044 A1 | 12/2010 | Sakai et al. | | |
| 2011/0186875 A1 | 8/2011 | Egoshi et al. | | |
| 2011/0186886 A1 | 8/2011 | Watari et al. | | |
| 2011/0186900 A1 | 8/2011 | Watari et al. | | |
| 2011/0186901 A1 | 8/2011 | Ushiyama et al. | | |
| 2011/0193112 A1 | 8/2011 | Inoue et al. | | |
| 2011/0291541 A1* | 12/2011 | Muranaka et al. | | 313/42 |
| 2012/0080674 A1 | 4/2012 | Shimizu et al. | | |
| 2012/0126266 A1* | 5/2012 | Watari et al. | | 257/98 |
| 2012/0132949 A1* | 5/2012 | Watari et al. | | 257/99 |
| 2012/0273826 A1* | 11/2012 | Yamamoto et al. | | 257/99 |

FOREIGN PATENT DOCUMENTS

| | | |
|---|---|---|
| JP | 2004-274027 | 9/2004 |
| JP | 2004247612 | 9/2004 |
| JP | 2006093672 | 4/2006 |
| JP | 2006147622 | 6/2006 |
| JP | 2007027281 | 2/2007 |
| JP | 2008-42158 A | 2/2008 |
| JP | 2008112966 | 5/2008 |
| JP | 2008218469 | 9/2008 |
| JP | 1375900 | 12/2009 |
| JP | 1375901 | 12/2009 |
| WO | 2008/153043 A1 | 12/2008 |
| WO | 2008153043 | 12/2008 |
| WO | 2009/072757 A2 | 6/2009 |
| WO | 20090082177 | 7/2009 |

OTHER PUBLICATIONS

Japanese Office Action issued on Jun. 28, 2013 in the counterpart Japanese patent application No. 2010-186505, an English translation thereof.

Japanese Office Action issued on May 21, 2013 in the counterpart Japanese patent application No. 2010-186505, an English translation thereof.

Taiwanese Office Action issued on Jul. 3, 2013 in counterpart Taiwanese patent application No. 100101959, along with English translation.

\* cited by examiner

LED PACKAGE AND METHOD FOR MANUFACTURING SAME

CROSS-REFERENCE TO RELATED APPLICATIONS

This application is based upon and claims the benefit of priority from the prior Japanese Patent Application No. 2010-019782, filed on Jan. 29, 2010 and the prior Japanese Patent Application No. 2010-186505, filed on Aug. 23, 2010; the entire contents of which are incorporated herein by reference.

FIELD

Embodiments described herein relate generally to an LED (Light Emitting Diode) package and a method for manufacturing the same.

BACKGROUND

Conventionally, an LED package in which an LED chip is mounted has been configured in the following manner for controlling light distribution characteristics and increasing an efficiency of extracting light from the LED package. Specifically, a cup-shaped enclosure made of a white resin is provided to a LED package. Then, an LED chip is mounted on a bottom surface of the enclosure. The inside of the enclosure is filled with a transparent resin to bury the LED chip therewith. The enclosure is formed of a thermoplastic polyamide resin in many cases (for instance, refer to JP-A 2004-274027 (Kokai)).

However, along with increased application range of LED packages, recent LED packages are required to have a higher durability. Meanwhile, along with increased output by LED chip, larger amounts of light and heat are radiated from LED chip, which facilitates degradation of a resin portion with which such an LED chip is sealed. Moreover, along with the increased application range of LED packages, further cost reduction is demanded.

DETAILED DESCRIPTION

Figure 1:
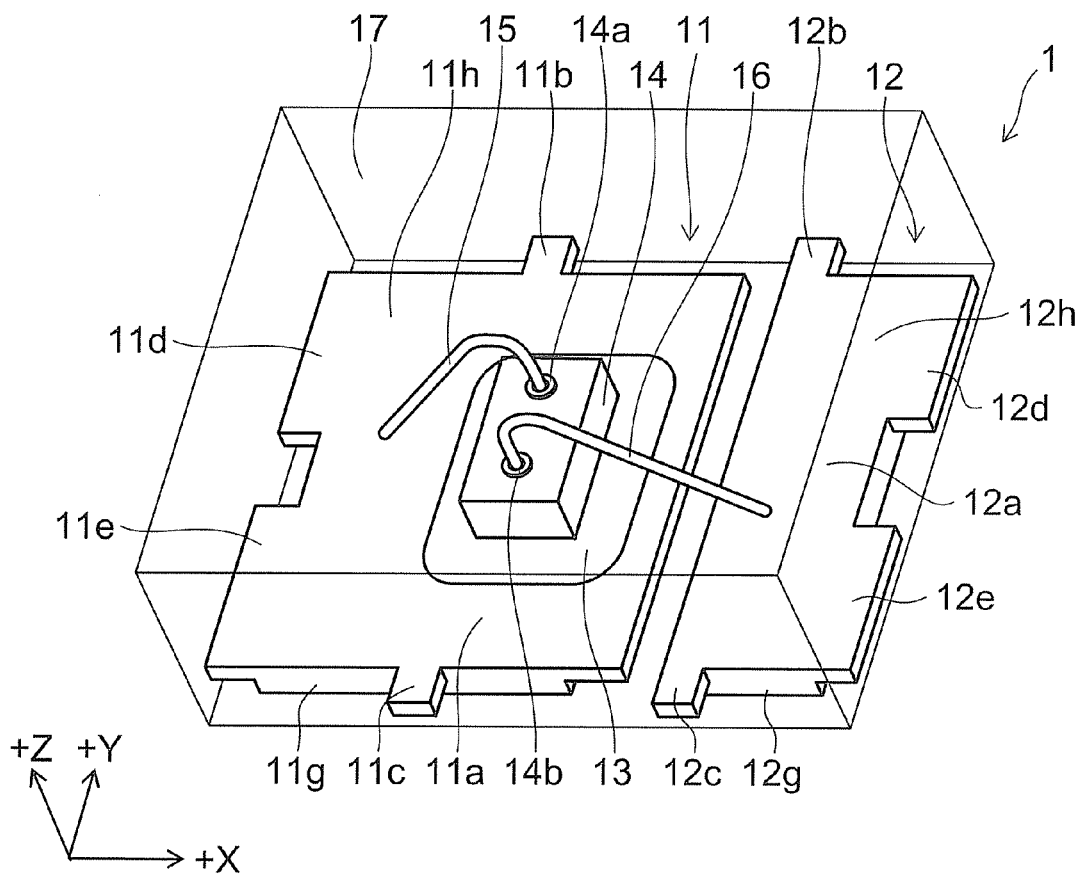
FIG. 1 is a perspective view illustrating an LED package according to a first embodiment.

In general, according to one embodiment, an LED package includes first and second lead frames, an LED chip and a resin body. The first and second lead frames are apart from each other. The LED chip is provided above the first and second lead frames, the LED chip includes a semiconductor layer which contains at least indium, gallium and aluminum, one terminal of the LED chip is connected to the first lead frame, and another terminal of the LED chip is connected to the second lead frame. The resin body covers the LED chip and an entire upper surface, a part of a lower surface, and parts of edge surfaces of each of the first and second lead frames, and the resin body exposes a rest of the lower surface and a rest of the edge surfaces. And, an appearance of the resin body is a part of an appearance of the LED package.

According to another embodiment, a method for manufacturing an LED package is disclosed. The method includes mounting an LED chip on each of element regions of a lead frame sheet, connecting one terminal of the LED chip to a first lead frame, and connecting another terminal of the LED chip to a second lead frame. The lead frame sheet includes a plurality of element regions arranged in a matrix array. A basic pattern is formed in each of the element regions. The basic pattern includes the first and second lead frames being apart from each other. And a conductive material remains in each of dicing areas between the element regions to connect the neighboring element regions together. The LED chip includes a semiconductor layer containing at least indium, gallium and aluminum. The method includes also forming a resin plate. The resin plate buries the LED chip in the resin plate and covers an entire upper surface and a part of a lower surface of each of the element regions of the lead frame sheet. The method includes also cutting portions of the lead frame sheet and the resin plate which are placed in the element region by removing portions of the lead frame sheet and the resin plate which are placed in the dicing areas. And, an appearance of the cut portions is a part of an appearance of the LED package.

Descriptions will be hereinafter provided for embodiments by referring to the drawings.

First of all, descriptions will be provided for a first embodiment.

FIG. 1 is a perspective view illustrating an LED package according to this embodiment.

Figure 2A:
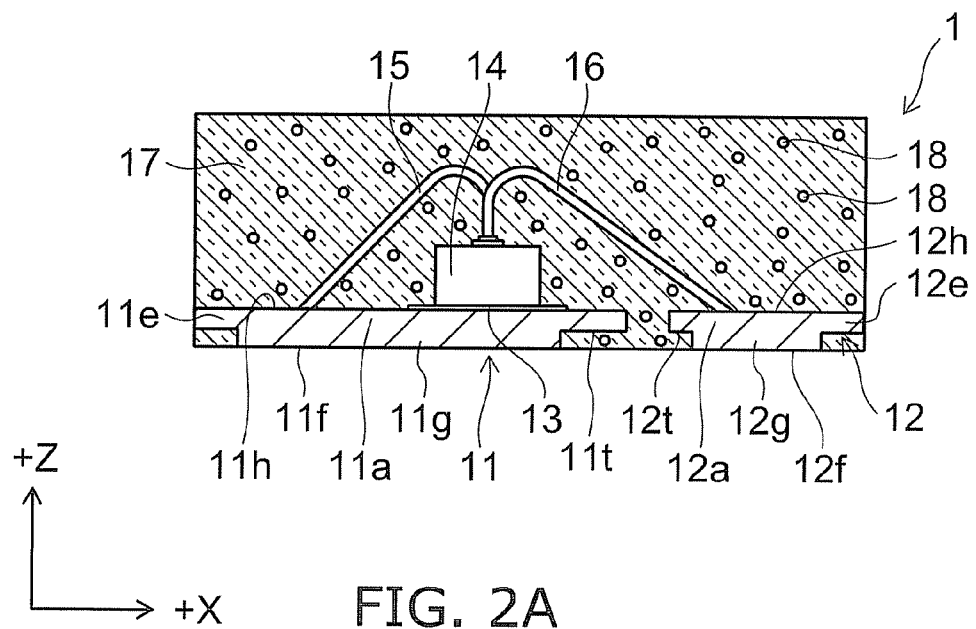
FIG. 2A is a cross-sectional view illustrating the LED package according to the first embodiment.
Figure 2B:
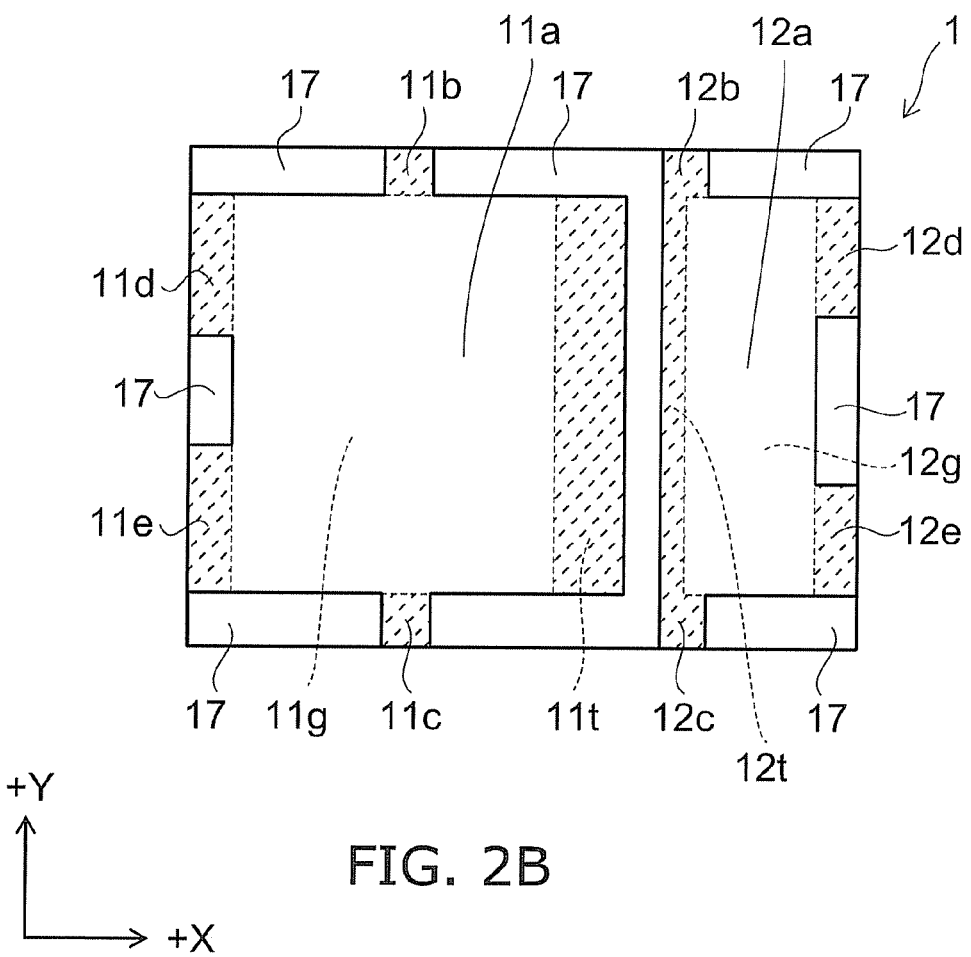
FIG. 2B is a plan view illustrating lead frames according to the first embodiment.

FIG. 2A is a cross-sectional view illustrating the LED package according to this embodiment, and FIG. 2B is a plan view illustrating lead frames according to this embodiment.

The LED package according to this embodiment is a package obtained by sealing an LED chip, which includes an InGaAlP layer, with a transparent resin body made of an epoxy resin, an acrylic resin or a urethane resin.

As shown in FIGS. 1 to 2B, paired lead frames 11, 12 are included in the LED package 1 according to this embodiment. The lead frames 11, 12 each have a planar shape. The lead frames 11, 12 are placed flush with but apart from each other. The lead frames 11, 12 are made of the same conductive material. The lead frames 11, 12 are made by forming silver plated layers on the respective upper and lower surfaces of a copper plate, for instance. No silver plated layer is formed on the edge surface of either of the lead frames 11, 12. Accordingly, the copper plate is exposed.

Descriptions will be continued by use of an orthogonal XYZ-coordinate system for the convenience sake herein. Out of directions in parallel with the upper surfaces of the lead frames 11, 12, a direction from the lead frame 11 to the lead frame 12 is defined as a +X direction. Out of directions perpendicular to the upper surfaces of the lead frames 11, 12, an upward direction, i.e., a direction from the lead frame 11 to a later-described LED chip 14, is defined as a +Z direction. Out of directions orthogonal to both the +X direction and the +Z direction, one direction is defined as a +Y direction. Note that the directions opposite to the +X direction, the +Y direction and the +Z direction are defined as a −X direction, a −Y direction and a −Z direction, respectively. In addition, for instance, the "+X direction" and the "−X direction" may be generically referred to as simply an X direction.

The lead frame 11 is provided with a single base portion 11a which is rectangular when viewed in a Z direction. Four extending portions 11b, 11c, 11d, 11e extend from this base portion 11a. The extending portion 11b extends in the +Y direction from a center portion of an edge of the base portion 11a, the edge facing in the +Y direction and extending in the +X direction. The extending portion 11c extends in the −Y direction from a center portion of an edge of the base portion 11a, the edge facing in the −Y direction and extending in the X direction. Each of the extending portions 11b to 11e extends from a corresponding one of three different sides of the base portion 11a in this manner. The location of the extending portion 11b and the location of the extending portion 11c coincide with each other in terms of the X direction. The extending portions 11d, 11e extend in the −X direction from the respective two end portions in an edge of the base portion 11a, the edge facing in the −X direction.

The length of the lead frame 12 in the X direction is shorter than the length of the lead frame 11 in the X direction, and the length of the lead frame 12 in the Y direction is equal to the length of the lead frame 11 in the Y direction. The lead frame 12 is provided with a single base portion 12a which has a rectangular shape when viewed in the Z direction. Four extending portions 12b, 12c, 12d, 12e extend from this base portion 12a. The extending portion 12b extends in the +Y direction from an end portion of an edge of the base portion 12a, the edge facing in the +Y direction and being farthest in the −X direction. The extending portion 12c extends in the −Y direction from an end portion of an edge of the base portion 12a, the edge facing in the −Y direction and being farthest in the −X direction. The extending portions 12d, 12e extend in the +X direction from two end portions of an edge of the base portion 12a, the edge facing in the +X direction. Each of the extending portions 12b to 12e extends from a corresponding one of three different sides of the base portion 12a in this manner. In addition, the width of the extending portions 11d, 11e of the lead frame 11 may be equal or unequal to the width of the extending portions 12d, 12e of the lead frame 12. In a case where the width of the extending portions 11d, 11e is set unequal to the width of the extending portions 12d, 12e, the anode and the cathode are easily distinguishable from each other.

A projected portion 11g is formed in a portion of a lower surface 11f of the lead frame 11, the portion corresponding to a center portion of the base portion 11a in the X direction. Accordingly, the lead frame 11 has two thicknesses in a way that: the center portion of the base portion 11a in the X direction, i.e., a portion where the projected portion 11g is formed, is a relatively thick plate portion; and two end portions of the base portion 11a in the X direction and the extending portions 11b to 11e are relatively thin plate portions. In FIG. 2B, a portion of the base portion 11a in which no projected portion 11g is formed is shown as a thin plate portion 11t. Similarly, a projected portion 12g is formed in a portion of a lower surface 12f of the lead frame 12, the portion corresponding to a center portion of the base portion 12a in the X direction. Accordingly, the lead frame 12 has two thicknesses, too, in a way that: the center portion of the base portion 12a in the X direction is a relatively thick plate portion because the projected portion 12g is formed; and two end portions of the base portion 12a in the X direction and the extending portions 12b to 12e are relatively thin plate portions. In FIG. 2B, a portion of the base portion 12a in which no projected portion 12g is formed is shown as a thin plate portion 12t. In other words, indentations are formed in two end portions, in the X direction, of the lower surfaces of the base portions 11a, 12a. The indentations extend in the Y direction along the edges of the base portions 11a, 12a. Note that, in FIG. 2B, the relatively thinner portions in each of the lead frames 11, 12, i.e., the thin plate portion and the extending portions are hatched with broken lines.

An upper surface 11h of the lead frame 11 and an upper surface 12h of the lead frame 12 are flush with each other. The projected portions 11g, 12g are formed in areas set apart from edges of the lead frames 11, 12, the edges facing each other. These areas including the edges form the thin plate portions 11t, 12t. The lower surface of the projected portion 11g of the lead frame 11 and the lower surface of the projected portion 12g of the lead frame 12 are flush with each other. The locations of the upper surfaces of the extending portions coincide with the locations of the upper surfaces of the lead frames 11, 12 in the Z direction. Accordingly, all the extending portions are placed on the same XY coordinate plane.

A die mounting material 13 is attached to a portion of an area of the upper surface 11h of the lead frame 11, the area corresponding to the base portion 11a. In this embodiment, it does not matter whether the die mounting material 13 is conductive or insulating. In a case where the die mounting material 13 is conductive, the die mounting material 13 is made of silver paste, solder or eutectic solder, for instance. In a case where the die mounting material 13 is insulating, the die mounting material 13 is made of transparent resin paste, for instance.

The LED chip 14 is placed on the die mounting material 13. In other words, the LED chip 14 is fixedly bonded to the lead frame 11 with the die mounting material. Thereby, the LED chip 14 is mounted on the lead frame 11. The LED chip 14 includes a semiconductor layer which contains indium (In), gallium (Ga), aluminum (Al) and phosphorus (P). For instance, as an active layer, the InGaAlP layer is formed on a sapphire substrate. This makes the LED chip 14 emit light in a wavelength range from green to red. The shape of the LED chip 14 is a cuboid, for instance. Terminals 14a, 14b are placed on the upper surface of the LED chip 14.

An end of a wire 15 is bonded to the terminal 14a of the LED chip 14. The wire 15 is led out from the terminal 14a in the +Z direction (in the upright direction), and is curved in a direction between the −X direction and the −Z direction. The other end of the wire 15 is bonded to the upper surface 11h of the lead frame 11. Thereby, the terminal 14a is connected to the lead frame 11 through the wire 15. On the other hand, an end of a wire 16 is bonded to the terminal 14b. The wire 16 is led out from the terminal 14b in the +Z direction, and is curved in a direction between the +X direction and the −Z direction. The other end of the wire 16 is bonded to the upper surface 12h of the lead frame 12. Thereby, the terminal 14b is connected to the lead frame 12 through the wire 16. The wires 15, 16 are made of a metal such as gold or aluminum.

The LED package 1 further includes a transparent resin body 17. The transparent resin body 17 is made of a transparent resin material such as an epoxy resin, an acrylic resin or a urethane resin. Otherwise, the transparent resin body 17 may be made of multiple resin materials selected from these resin materials. Note that "transparent" covers translucent. An appearance of the transparent resin body 17 is a cuboid. The transparent resin body 17 covers the lead frames 11, 12, the die mounting material 13, the LED chip 14, and the wires 15, 16. The appearance of the transparent resin body 17 is a part of the appearance of the LED package 1. Note that, other parts of the appearance of the LED package 1 are formed by the projected portions of the lead frames 11 and 12. Parts of the lead frame 11 and parts of the lead frame 12 are exposed on the lower and side surfaces of the transparent resin body 17.

More specifically, the lower surface of the projected portion 11g, which is a part of the lower surface 11f of the lead frame 11, is exposed on the lower surface of the transparent resin body 17. In addition, tip edge surfaces of the respective extending portions 11b to 11e are exposed on the corresponding side surfaces of the transparent resin body 17. On the other hand, in the lead frame 11, all of the upper surface 11h, the lower surface 11f exclusive of the lower surface of the projected portion 11g, the side surfaces of the projected portion 11g and the edge surfaces of the base portion 11a are covered with the transparent resin body 17. Similarly, the lower surface of the projected portion 12g of the lead frame 12 is exposed on the lower surface of the transparent resin body 17. In addition, tip edge surfaces of the respective extending portions 12b to 12e are exposed on the corresponding side surfaces of the transparent resin body 17. All of the upper surface 12h, the lower surface 12f exclusive of the lower surface of the projected portion 12g, and side surfaces of the projected portion 12g and the edge surfaces of the base portion 12a are covered with the transparent resin body 17. In the LED package 1, the lower surfaces of the projected portions 11g, 12g which are exposed on the lower surface of the transparent resin body 17 serve as external electrode pads. As described above, the transparent resin body 17 has a rectangular shape when viewed from the above, and each of the tip edge surfaces of the multiple extending portions of respective lead frames is exposed on the three side surfaces of the transparent resin body 17. Note that in this specification, the concept of "cover" includes both: the state of contact between a covering matter and a covered matter; and the state of separation between a covering matter and a covered matter.

The LED package 1 according to this embodiment is mounted on a mother board (not illustrated) by bonding solder balls or the like, which are placed on the mother board, to the projected portions 11g, 12g. An electric power is supplied to the terminals 14a, 14b of the LED chip 14 through the lead frames 11, 12 and the wires 15, 16, respectively. Thereby, the LED chip 14 emits light of a predetermined color which is included in the wavelength range from green to red. This light passes through the inside of the transparent resin body 17, and goes out of the LED package 1 directly. Accordingly, the light going out of the LED package 1 is light emitted by the LED chip 14, and is visible light included in the wavelength range from green to red.

Next, descriptions will be provided for a method for manufacturing the LED package according to this embodiment.

Figure 3:
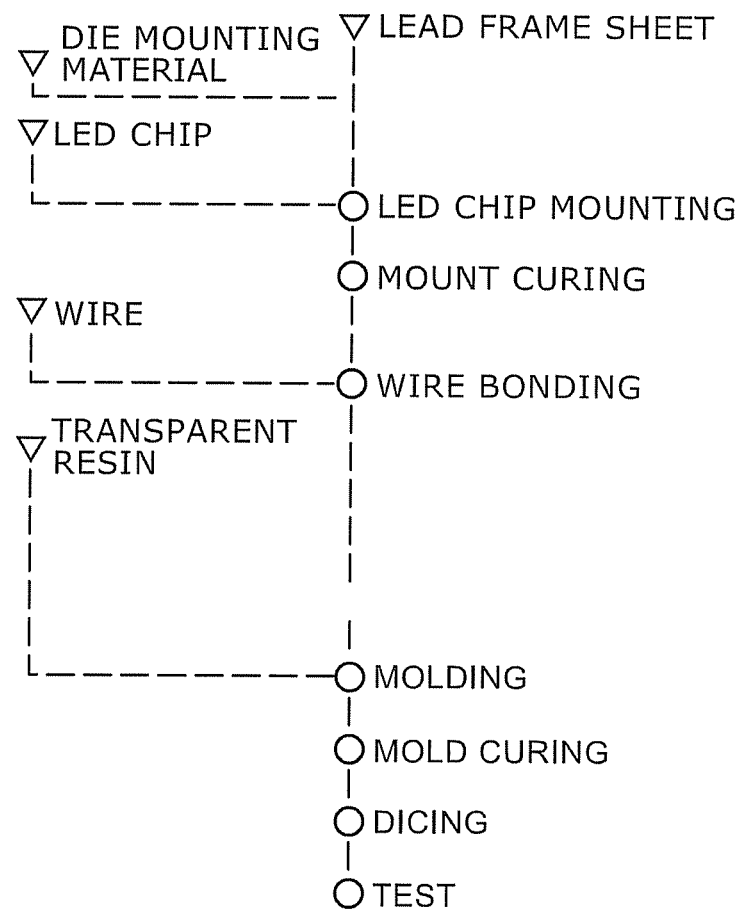
FIG. 3 is a flowchart diagram illustrating a method for manufacturing the LED package according to the first embodiment.

FIG. 3 is a flowchart diagram illustrating the method for manufacturing the LED package according to this embodiment.

FIGS. 4A to 4D, 5A to 5C and 6A and 6B are process cross-sectional views illustrating the method of manufacturing the LED package according to this embodiment.

Figure 7A:
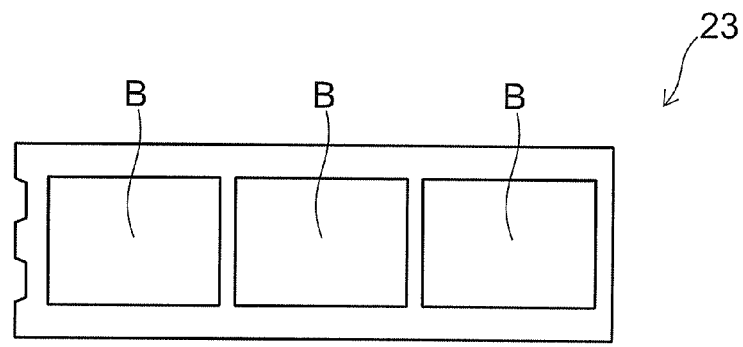
FIG. 7A is a plan view illustrating a lead frame sheet according to the first embodiment.
Figure 7B:
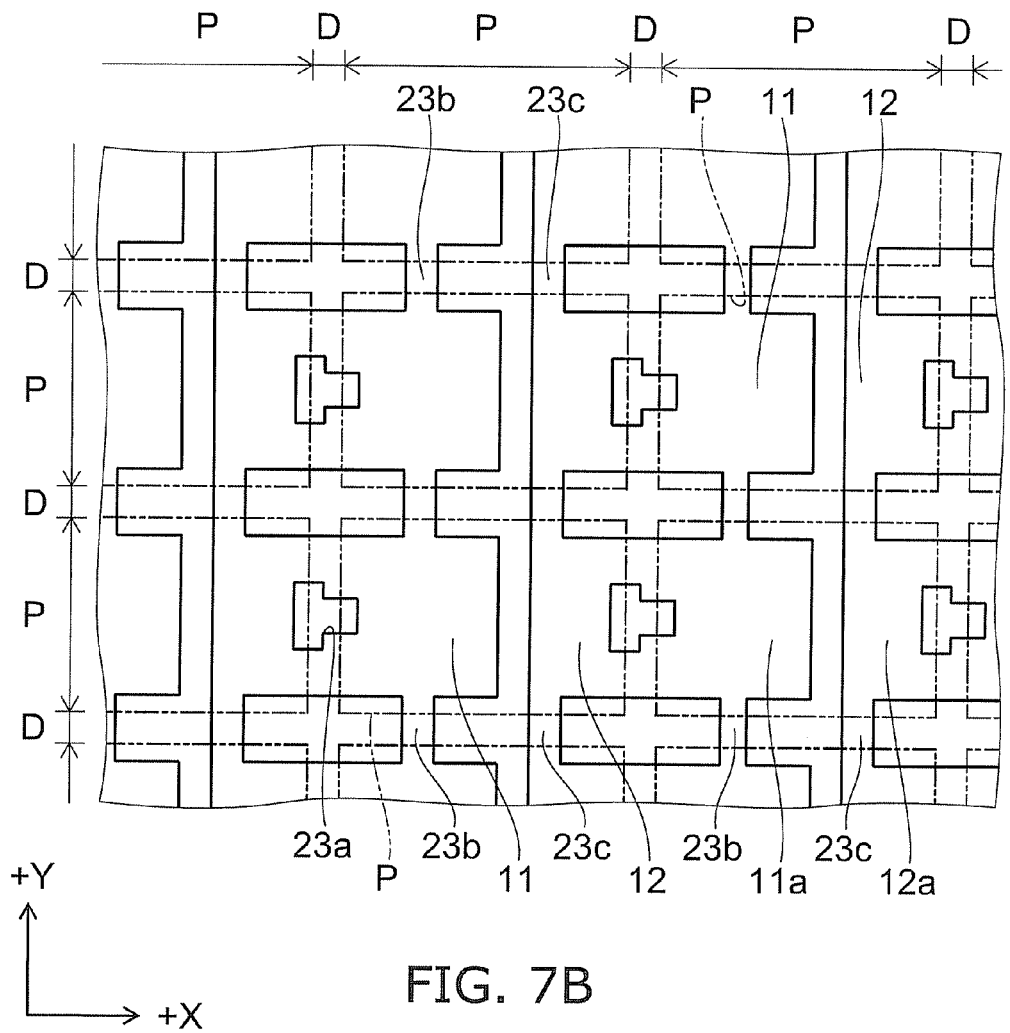
FIG. 7B is a partially-enlarged plan view illustrating an element region in this lead frame sheet.

FIG. 7A is a plan view illustrating a lead frame sheet according to this embodiment. FIG. 7B is a partially-enlarged plan view illustrating an element region in this lead frame sheet.

Figure 4A:
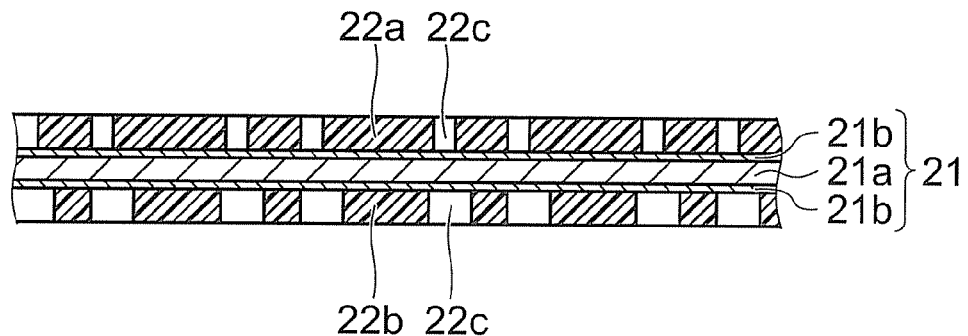
FIGS. 4A to 6B are process cross-sectional views illustrating the method for manufacturing the LED package according to the first embodiment.

First of all, as shown in FIG. 4A, a conductive sheet 21 made of a conductive material is prepared. This conductive sheet 21 is obtained by forming silver plated layers 21b respectively on the upper and lower surfaces of a strip-shaped copper plate 21a. Subsequently, masks 22a, 22b are respectively formed on the resultant upper and lower surfaces of this conductive sheet 21. Opening portions 22c are selectively made in the masks 22a, 22b. The masks 22a, 22b can be formed by printing, for instance.

Thereafter, the conductive sheet 21 to which the masks 22a, 22b are attached is dipped into an etching fluid. Thereby, the conductive sheet 21 is wet-etched. Accordingly, portions, of the conductive sheet 21, situated inside the opening portions 22c are selectively etched. When the conductive sheet 21 is wet-etched, the etching amount is controlled, for instance, by adjusting the dipping time. Thereby, the etching is terminated before the conductive sheet 21 is penetrated singly by any opening portion etched only from the upper or lower surface of the conductive sheet 21. By this, half-etching is applied to the conductive sheet 21 from the upper and lower surfaces of the conductive sheet 21. However, portions etched from both the upper and lower surfaces of the conductive sheet 21 are made to penetrate the conductive sheet 21. After this, the masks 22a, 22b are removed.

Figure 4B:
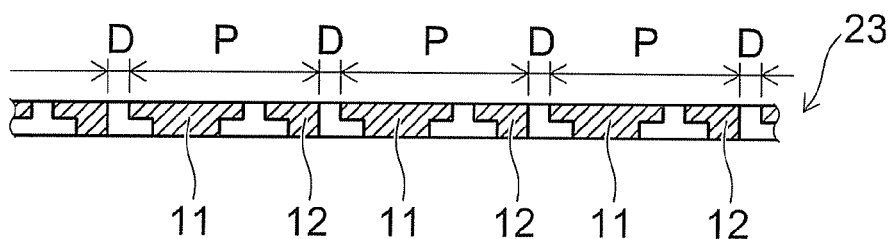

Thereby, as shown in FIGS. 3 and 4B, the copper plate 21a and the silver plated layers 21b are selectively removed from the conductive sheet 21. Thus, a lead frame sheet 23 is formed. Note that, for the sake of illustrative convenience, FIG. 4B and the ensuing drawings each show the copper plate 21a and the silver plated layers 21b as the unitary lead frame sheet 23 instead of individually showing the copper plate 21a and the silver plated layers 21b. As shown in FIG. 7A, for instance, three blocks B are set up in the lead frame sheet 23. In addition, for instance, approximately 1000 element regions P are set up in each block B. As shown in FIG. 7B, the element regions P are arranged in the form of a matrix array, and a dicing area D arranged in the form of a lattice is made between the element regions P. A basic pattern including the mutually-isolated lead frames 11, 12 is formed in each element region P. Residues of the conductive materials forming the conductive sheet 21 remain in each dicing area D in a way that the residues connect the neighboring element regions P.

To put it specifically, although the lead frame 11 and the lead frame 12 are apart from each other in each element region P, the lead frame 11 belonging to any one element region P is connected to the lead frame 12 belonging to a neighboring element region P which is situated next to the element region P in the −X direction. An opening portion 23a facing and projecting in the +X direction is formed between the two neighboring frames. The lead frames 11 respectively belonging to two neighboring element regions P in the Y direction are connected together through a corresponding bridge 23b. Similarly, the lead frames 12 respectively belonging to two neighboring element regions P in the Y direction are connected together through a corresponding bridge 23c. Thereby, four connecting portions extend in three directions from each of the base portions 11a of the lead frames 11 and the base portions 12a of the lead frames 12. The connecting portions are made of conductive material, and extend from the base portion of the lead frame 11 or 12 belonging to one element region P to the base portion of the lead frame 11 or 12 belonging to an adjacent element portion P through the dicing region D. In addition, by achieving the etching from the lower surface of the lead frame sheet 23 as half-etching, the projected portions 11g, 12g are formed on the lower surfaces of the lead frames 11, 12 (see FIG. 2), respectively.

Figure 4C:
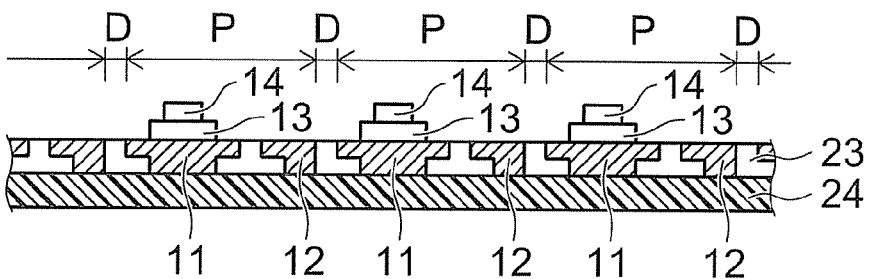

Subsequently, as shown in FIGS. 3 and 4C, a reinforcing tape 24 made of a polyimide is pasted to the lower surface of the lead frame sheet 23, for instance. Thereafter, the die mounting material 13 is attached to the top of the lead frame 11 belonging to each element region P in the lead frame sheet 23. The attachment is achieved, for instance, by ejecting the die mounting material 13, which is pasty, to the top of the lead frame 11, or by transferring the die mounting material 13 to the top of the lead frame 11 by use of a mechanical instrument. Thereafter, the LED chip 14 is mounted on the top of the die mounting material 13. Afterward, the die mounting material 13 is subjected to thermal treatment (mount cure) for sintering the die mounting material 13. Thereby, in each element region P in the lead frame sheet 23, the LED chip 14 is mounted on the lead frame 11 with the die mounting material 13 being interposed in between.

Figure 4D:
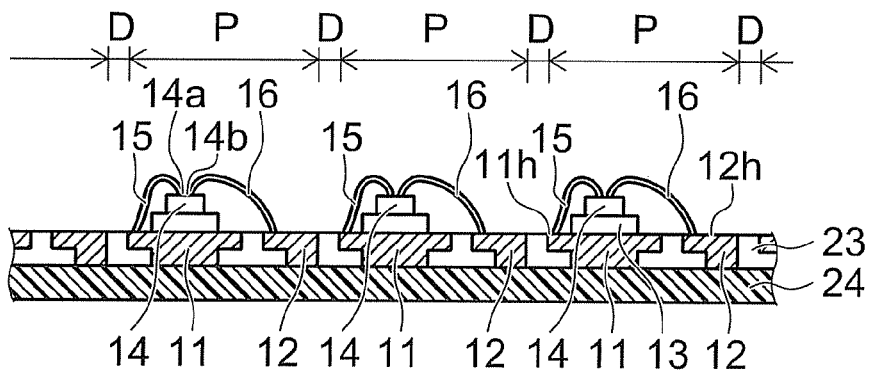

After that, as shown in FIGS. 3 and 4D, one end of the wire 15 is bonded to the terminal 14a of the LED chip 14, and the other end of the wire 15 is bonded to the upper surface 11h of the lead frame 11 by ultrasonic bonding, for instance. In addition, one end of the wire 16 is bonded to the terminal 14b of the LED chip 14, and the other end of the wire 16 is bonded to the upper surface 12h of the lead frame 12. Thereby, the terminal 14a is connected to the lead frame 11 through the wire 15, and the terminal 14b is connected to the lead frame 12 through the wire 16.

Figure 5A:
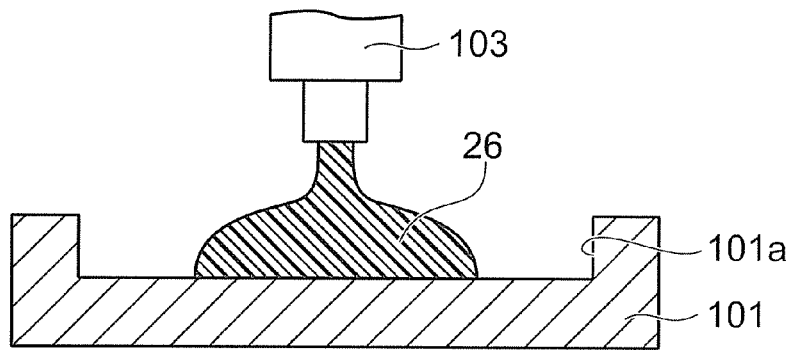

Afterward, a lower die 101 is prepared as shown in FIGS. 3 and 5A. The lower die 101 and an upper die 102, which will be described later, form a pair of dies. A cuboid-shaped recessed portion 101a is formed in the upper surface of the lower die 101. On the other hand, a liquid or semi-liquid resin material 26 is prepared which is made of a transparent resin such as an epoxy resin, an acrylic resin or a urethane resin. Subsequently, the resin material 26 is supplied to the inside of the recessed portion 101a in the lower die 101 by use of a dispenser 103.

Figure 5B:
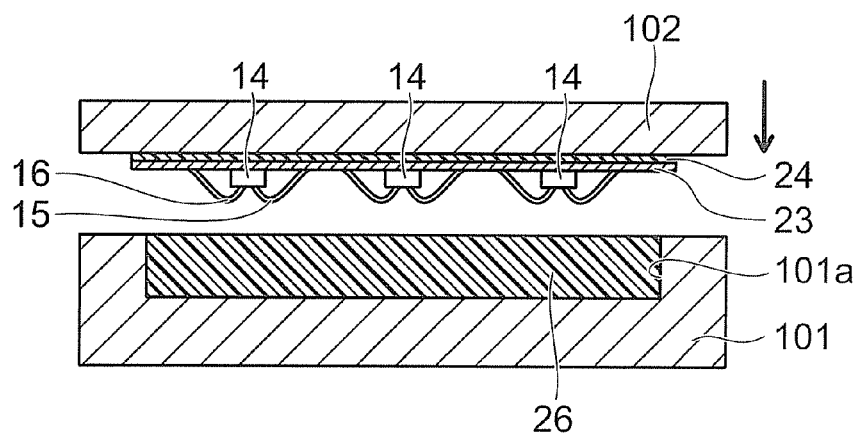

Thereafter, as shown in FIGS. 3 and 5B, the lead frame sheet 23 on which the LED chips 14 are mounted is provided to the lower surface of the upper die 102 in a way that the LED chips face downward. Afterward, the upper die 102 is pressed to the lower die 101. Thus, the dies are clamped together. Thereby, the lead frame sheet 23 is pressed to the resin material 26. At this time, the resin material 26 covers the LED chips 14 and the wires 15, 16, and additionally enters portions which have been removed from the lead frame sheet 23 through the etching process. The resin material 26 is molded in this manner. It is desirable that this molding process should be performed in a vacuum atmosphere. This prevents air bubbles, which would otherwise occur in the fluorescent material containing resin material 26, from being attached to the half-etched portions of the lead frame sheet 23.

Figure 5C:
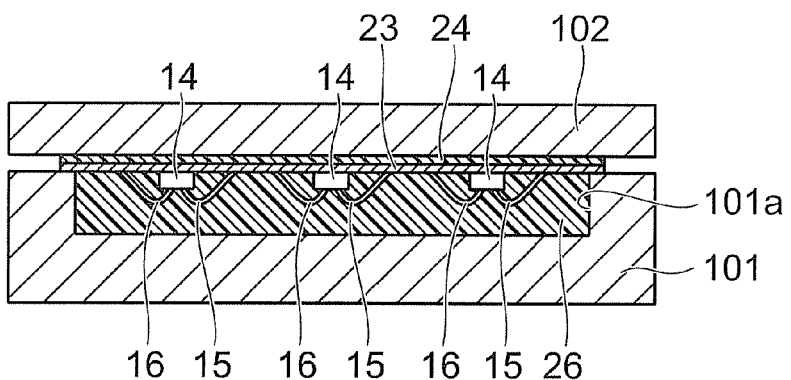
Figure 6A:
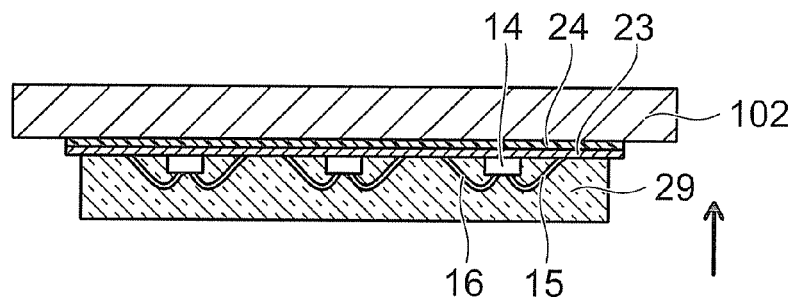

After that, as shown in FIGS. 3 and 5C, the resin material 26 is subjected to thermal process (mold cure) with the upper surface of the lead frame sheet 23 being pressed to the resin material 26. Thus, the resin material 26 is cured. Subsequently, as shown in FIG. 6A, the upper die 102 is detached from the lower die 101. Thereby, a transparent resin plate 29, which covers all of the upper surface and parts of the lower surface of the lead frame sheet 23 as well as embeds the LED chips 14 and the like, is formed on the lead frame sheet 23. Thereafter, the reinforcing tape 24 is peeled from the lead frame sheet 23. Thereby, the lower surfaces of the projected portions 11g, 12g of the lead frames 11, 12 (see FIG. 2) are exposed on the surface of the transparent resin plate 29.

Figure 6B:
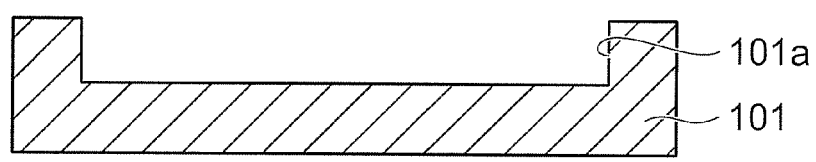

Afterward, as shown in FIGS. 3 and 6B, the combined body including the lead frame sheet 23 and the transparent resin plate 29 are diced with a blade 104 from the lead frame sheet 23-side. In other words, the combined body is diced in the +Z direction. By this, portions of the lead frame sheet 23 and the transparent resin plate 29, which are placed in the dicing area D, are removed from the lead frame sheet 23 and the transparent resin plate 29. As a result, portions of the lead frame sheet 23 and the transparent resin plate 29, which are placed in the element regions P, are cut into discrete cubes. Thus, LED packages 1 as shown in FIGS. 1 to 2B are produced as the discrete cubes. Note that the combined body including the lead frame sheet 23 and the transparent resin plate 29 may be diced from the transparent resin plate 29-side.

In each of the LED packages 1 thus diced, the lead frames 11, 12 are separated from the lead frame sheet 23. In addition, the transparent resin plate 29 is segmented into the transparent resin bodies 17. The passing of some of the dicing areas D which extend in the Y direction over the opening portions 23a in the lead frame sheets 23 forms the extending portions 11d, 11e for each lead frame 11, and the extending portions 12d, 12e for each lead frame 12. Furthermore, the bisecting of the bridges 23b forms the extending portions 11b, 11c for each lead frame 11, and the bisecting of the bridges 23c forms the extending portions 12b, 12c for each lead frame 12. The tip edge surfaces of the extending portions 11b to 11e and 12b to 12e are exposed on the corresponding side surfaces of the transparent resin body 17.

Afterward, as shown in FIG. 3, various tests are applied to the LED packages 1. The tip edge surfaces of the extending portions 11b to 11e and 12b to 12e may be used as terminals for the tests.

Hereinafter, effects of this embodiment will be described.

In the LED package 1 according to this embodiment, the LED chip 14 is a chip in which the semiconductor layer containing indium, gallium, aluminum and phosphorus is included as the active layer, and emits light in the wavelength range from green to red. The energy level of light in the wavelength range from green to red is lower than the energy level of light in a wavelength range from ultraviolet to blue. For this reason, light in the wavelength range from green to red damages the resin material less than light in a wavelength range from ultraviolet to blue. Accordingly, the deterioration of the transparent resin body 17 progresses slower, and the durability of the LED package 1 according to this embodiment is higher. Consequently, the LED package 1 according to this embodiment has a longer life and a higher reliability, and can be applied to a wider use range.

Furthermore, in the LED package 1 according to this embodiment, the amount of energy of light emitted from the LED chip 14 is smaller. Thus, the transparent resin body 17 can be made of a relatively low-cost resin material such as an epoxy resin, an acrylic resin or a urethane resin. For this reason, a resin material having better light resistance but being higher in cost, such as a silicone resin, need not be used any longer. Accordingly, the cost of the LED package 1 according to this embodiment is lower.

Moreover, the LED package 1 according to this embodiment includes no enclosure made of a white resin. Thus, there is no enclosure that deteriorates through absorption of light and heat produced by the LED chip 14. Particularly, in a case where an enclosure is formed of a thermoplastic polyamide resin, the deterioration of such an enclosure tends to progress faster. However, the embodiment is free from this problem. Accordingly, the LED package 1 in this embodiment has a higher durability.

Further, the LED package 1 according to this embodiment includes no enclosure which covers the side surfaces of the transparent resin body 17. For this reason, the LED package 1 according to this embodiment emits light at a wide angle. This makes the LED package 1 according to this embodiment advantageous when the LED package 1 needs to be used to emit light at a wider angle, for instance, when the LED package 1 is used for illumination or as a backlight for a liquid crystal television.

Besides, in the LED package 1 according to this embodiment, the peripheral portions of the lead frames 11, 12 is held by the transparent resin body 17 which covers part of the lower surface and most of the edge surfaces of the lead frames 11, 12. For this reason, the performance of the holdability of the lead frames 11, 12 can be enhanced while the external electrode pads are being formed by exposing the lower surfaces of the projected portions 11g, 12g of the lead frames 11, 12 from the transparent resin body 17. In other words, the indentations are formed in the two end portions, in the X direction, of the lower surfaces of the base portions 11a, 12a by forming the projected portions 11g, 12g in the center portions of the base portions 11a, 12a in the X direction, respectively. In addition, part of the transparent resin body 17 enters each indentation. This enables the lead frames 11, 12 to be firmly held by the transparent resin body 17. Thereby, the lead frames 11, 12 are hardly come off the transparent resin body 17 at the time of dicing, and can accordingly enhance the yields of LED packages 1. Moreover, this can prevent that lead frames 11 and 12 detach from the transparent resin body 17 by temperature stress in using the LED package 1.

Furthermore, in the LED package 1 according to this embodiment, the silver plated layers are formed on the upper and lower surfaces of the lead frames 11, 12. The silver plated layer has a higher light reflectance. This enhances the light extraction efficiency of the LED package 1 according to this embodiment.

Moreover, in this embodiment, a large number of LED packages 1, for instance, thousands of LED packages 1 can be manufactured from one conductive sheet 21 at a time. This reduces the manufacturing costs per LED package 1. In addition, the exclusion of an enclosure from each LED package 1 decreases the number of parts included in the LED package 1 and the number of manufacturing processes, and accordingly reduces the costs.

Further, in this embodiment, the lead frame sheet 23 is formed by wet-etching. For this reason, each time LED packages are manufactured with a new layout, what is needed is the preparation of an original plate for the new mask. For this reason, this embodiment keeps the initial costs lower than a method for manufacturing the lead frame sheet 23 by die pressing or the like.

Besides, in the LED package 1 according to this embodiment, the extending portions extend from each of the base portions 11a, 12a of the lead frames 11, 12. This prevents each base portion from being exposed on the side surfaces of the transparent resin body 17, and accordingly reduces the area of exposure of each of the lead frames 11, 12. Moreover, the contact area between lead frames 11 and 12 and the transparent resin body 17 can be made to increase. Consequently, it is possible to prevent the lead frames 11, 12 from being detached from the transparent resin body 17, and, in addition, to inhibit the corrosion of the lead frames 11, 12.

When the effects are viewed in terms of the manufacturing method, as shown in FIG. 7B, the amount of metal present in the dicing areas D is decreased by forming the opening portions 23a and the bridges 23b, 23c in the lead frame sheet 23 in a way that the opening portions 23a and the bridges 23b, 23c are present in the dicing areas D. This makes it easy to dice the lead frame sheet 23, and accordingly makes it possible to inhibit the abrasion of the dicing blade. Furthermore, in the embodiment, the four extending portions extend in the three directions from each of the lead frames 11, 12. Thereby, the lead frame 11 in any element region P is securely supported by the lead frames 11, 12 belonging to the neighboring element regions P in the three directions during the process of mounting the LED chips 14, which is shown in FIG. 4C. Thus, the mountability is enhanced. Similarly, each wire bonding location is securely supported in the three directions during the wire bonding process, which is shown in FIG. 4D. This allows less of an ultrasonic wave to escape when the ultrasonic wave is applied for ultrasonic bonding, for instance. Accordingly, each wire can be bonded to the corresponding lead frame and LED chip in a better condition.

Moreover, in this embodiment, the dicing is performed from the lead frame sheet 23-side during the dicing process, which is shown in FIG. 6B. This dicing makes the metal materials, which form the cut end portions of the lead frames 11, 12, extend on the corresponding side surfaces of the transparent resin bodies 17 in the +Z direction. This avoids the extension of the metal materials on the corresponding side surfaces of the transparent resin bodies 17 in the −Z direction, and accordingly the metal materials sticking out of the lower surface of the LED packages 1. For this reason, no burr is produced in the dicing process. Consequently, the embodiment can avoid failure in the mounting which would otherwise occur due to burrs while mounting the LED packages 1.

Next, descriptions will be provided for a variation of the embodiment.

The variation is that which is introduced into a method for forming a lead frame sheet.

To put it specifically, the variation is different from the first embodiment in that the variation does not employ the method for forming a lead frame sheet which is shown in FIG. 4A.

FIGS. 8A to 8H are process cross-sectional views illustrating the method for forming a lead frame sheet according to this variation.

Figure 8A:
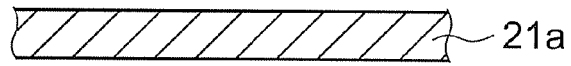
FIGS. 8A to 8H are process cross-sectional views illustrating a method for forming a lead frame sheet according to a variation of the first embodiment.
Figure 8B:
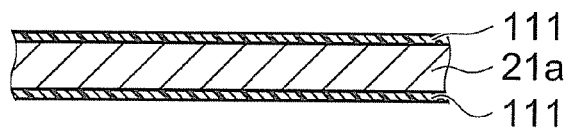
Figure 8C:
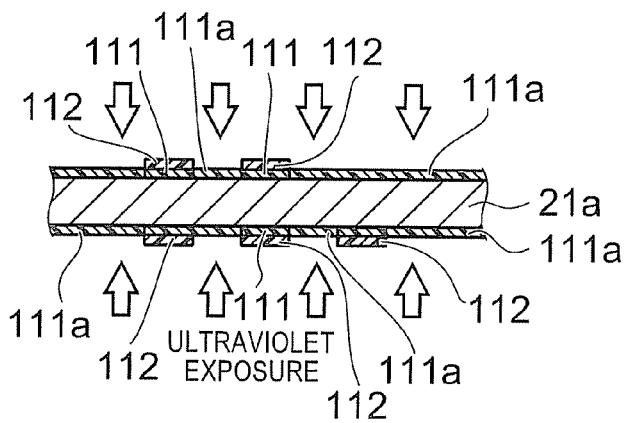
Figure 8D:
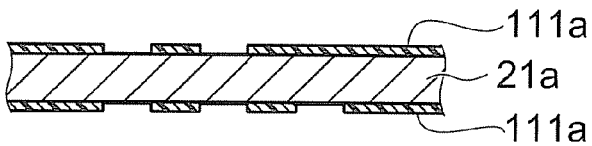
Figure 8E:
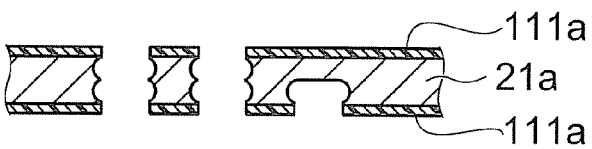
Figure 8F:
Figure 8G:
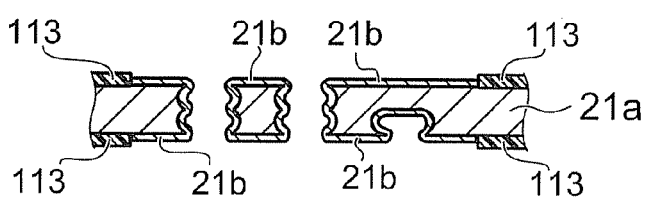
Figure 8H:
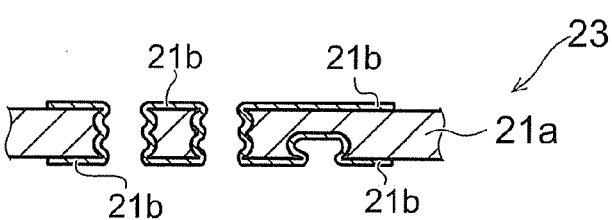

First of all, as shown in FIG. 8A, a copper plate 21a is prepared and cleaned. Subsequently, as shown in FIG. 8B, the two surfaces of the copper plate 21a is coated with a resist, followed by drying. Thereby, resist films 111 are formed. Thereafter, as shown in FIG. 8C, mask patterns 112 are placed on the respective resist films 111, and the resultant resist films 111 are exposed to ultraviolet light by irradiating the resist films 111 with the ultraviolet light. By this, exposed portions of each resist film 111 are cured, and resist patterns 111a are thus formed. Afterward, as shown in FIG. 8D, the resist films 111 are developed, and uncured portions of each resist film 111 are thus washed away. Thereby, the resist patterns 111a remain on the upper and lower surfaces of the copper plate 21a. After that, as shown in FIG. 8E, the resultant copper plate 21a is subjected to etching by using the resist patterns 111a as the masks. Thus, exposed portions of the copper plate 21a are removed from the two surfaces of the copper plate 21a. At this time, the etching depth is set almost equal to a half of the plate thickness of the copper plate 21a. An area etched from one side alone is half-etched, and an area of the copper plate 21a etched from both sides is penetrated. Subsequently, as shown in FIG. 8F, the resist patterns 111a are removed. Thereafter, as shown in FIG. 8G, plating is applied to the copper plate 21a with the end portions of the copper plate 21a being covered with masks 113. Thereby, silver plated layers 21b are formed on the respective surfaces of the copper plate 21a except for the end portions thereof. Afterward, as shown in FIG. 8H, the masks 113 are removed by washing. After that, an inspection is carried out. The lead frame sheet 23 is produced in this manner. The configuration, manufacturing method, and operation/working-effects of the variation are the same as those of the first embodiment, except for what has been just described above.

Next, descriptions will be provided for a second embodiment.

Figure 9:
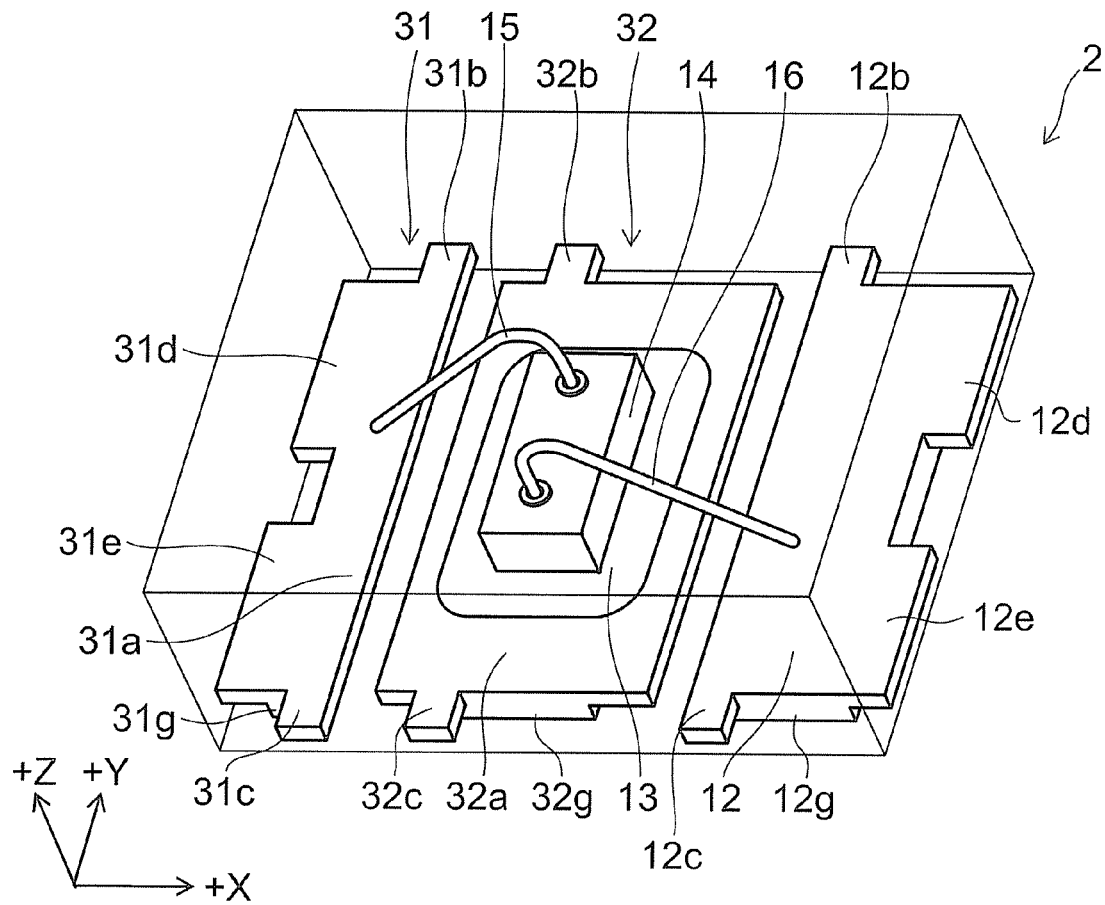
FIG. 9 is a perspective view illustrating an LED package according to a second embodiment.

FIG. 9 is a perspective view illustrating an LED package according to this embodiment.

Figure 10:
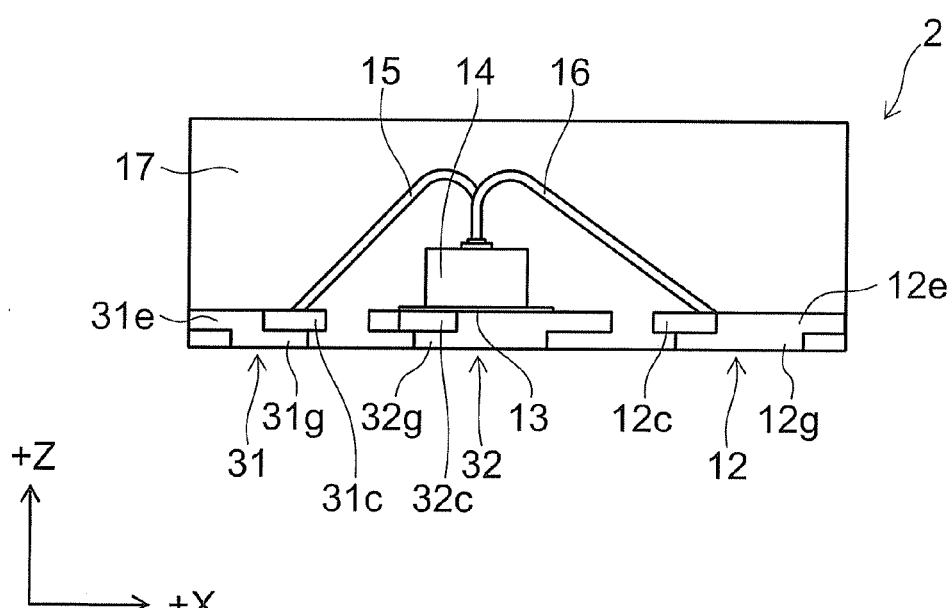
FIG. 10 is a side view illustrating the LED package according to the second embodiment.

FIG. 10 is a side view illustrating the LED package according to this embodiment.

As shown in FIGS. 9 and 10, the LED package 2 according to this embodiment is different from the LED package 1 according to the first embodiment (see FIG. 1) in that the lead frame 11 (see FIG. 1) is divided into two lead frames 31, 32 in the X direction. The lead frame 32 is placed between the lead frame 31 and the lead frame 12. Extending portions 31d, 31e, which correspond to the extending portions 11d, 11e of the lead frame 11 (see FIG. 1), are formed in the lead frame 31. In addition, extending portions 31b, 31c, which extend from a base portion 31a in the respective +Y and −Y directions, are formed in the lead frame 31. The locations of the respective extending portions 31b, 31c coincide with each other in terms of the X direction. Furthermore, the wire 15 is bonded to the lead frame 31. On the other hand, extending portions 32b, 32c, which correspond to the extending portions 11b, 11c of the lead frame 11 (see FIG. 1), are formed in the lead frame 32. The LED chip 14 is mounted on the lead frame 32 with the die mounting material 13 being interposed in between. Moreover, a projected portion corresponding to the projected portion 11g of the lead frame 11 is formed as a projected portion 31g in the lead frame 31, and as a projected portion 32g in the lead frame 32, in a way that the projected portions 31g, 32g are separated from each other.

In this embodiment, electric potentials are applied to the respective lead frames 31, 12 from the outside. Accordingly, the lead frames 31, 12 function as external electrodes. On the other hand, no electric potential needs to be applied to the lead frame 32. The lead frame 32 can be used as a lead frame dedicated for head sink application. Thus, when multiple LED packages 2 are mounted on a single module, lead frames 32 thereof can be connected to a common heat sink. Note that: a ground potential may be applied to the lead frame 32; or the lead frame 32 may be put in an electrically floating condition.

Furthermore, in a case where the LED packages 2 are mounted on a mother board, a so-called Manhattan phenomenon can be inhibited if solder balls are bonded to the respective lead frames 31, 32, and 12 of each LED package 2. The Manhattan phenomenon is a phenomenon in which, when the device or the like is mounted on a substrate with multiple solder balls or the like being interposed in between, a device or the like is lifted up due to inconsistency in the timing of solder ball fusion or a surface tension of fused solder in a reflow furnace. The Manhattan phenomenon causes failure in mounting. This embodiment makes the Manhattan phenomenon hard to occur by densely placing solder balls in the X direction in a lead frame layout symmetrical in the X direction.

Furthermore, in this embodiment, the wire 15 is bonded favorably because the lead frame 31 is supported by the extending portions 31b to 31e in the three directions. Similarly, the wire 16 is bonded favorably because the lead frame 12 is supported by the extending portions 12b to 12e in the three directions.

Such LED packages 2 can be manufactured with the same method as that in the first embodiment, except that the basic pattern of the element regions P in the lead frame sheet 23 is changed in the process shown in FIG. 4A. In other words, the manufacturing method, which has been described in connection with the first embodiment, enables LED packages to be manufactured with various layouts by changing the patterns of the masks 22a, 22b. The configuration, manufacturing method, and operation/working-effects of this embodiment are the same as those of the first embodiment, except for what has been just described above.

Next, descriptions will be provided for a third embodiment.

Figure 11:
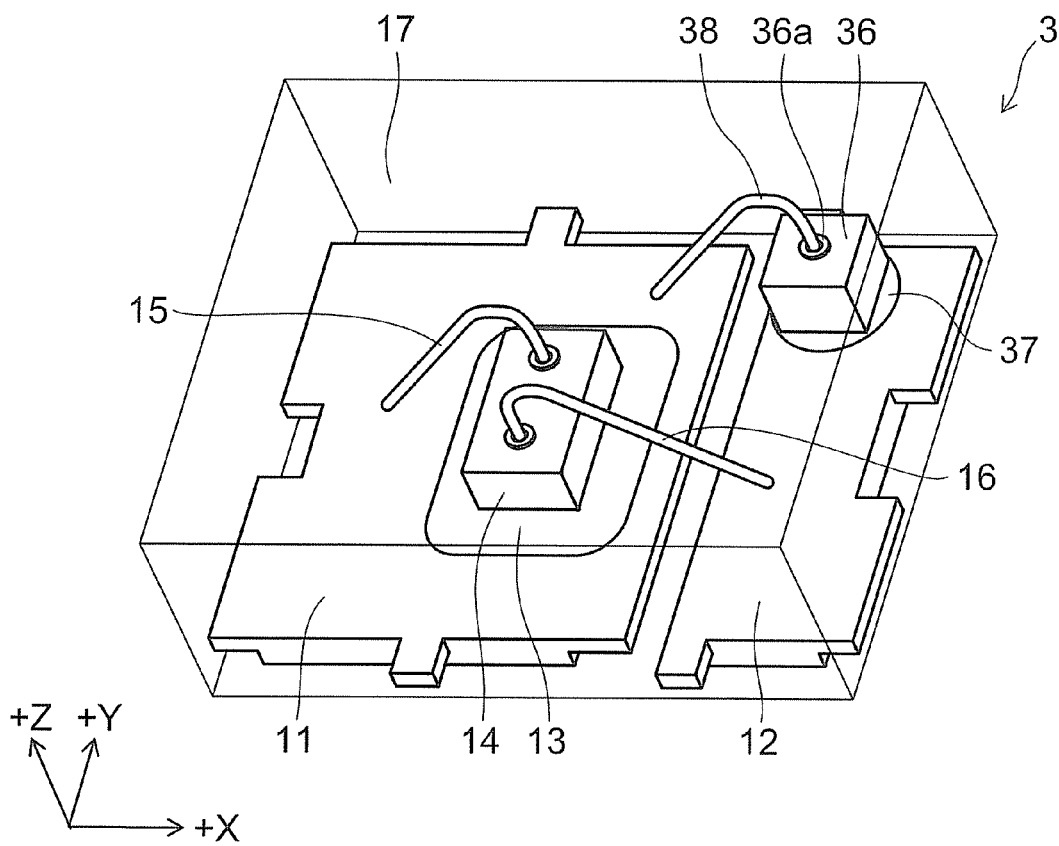
FIG. 11 is a perspective view illustrating an LED package according to a third embodiment.

FIG. 11 is a perspective view illustrating an LED package according to this embodiment.

Figure 12:
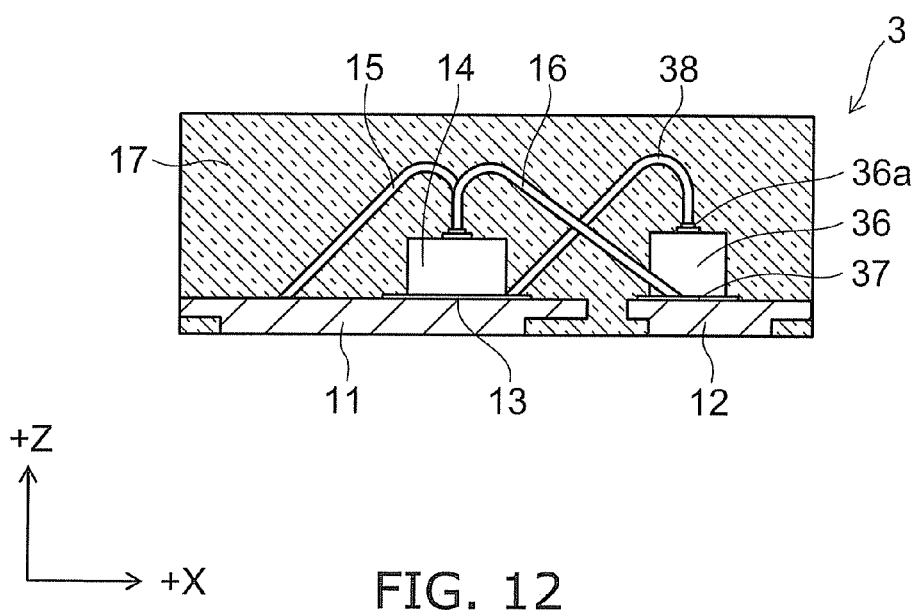
FIG. 12 is a cross-sectional view illustrating the LED package according to the third embodiment.

FIG. 12 is a cross-sectional view illustrating the LED package according to this embodiment.

As shown in FIGS. 11 and 12, the LED package 3 according to this embodiment includes a Zener diode chip 36 and the like in addition to the configuration of the LED package 1 according to the first embodiment (see FIG. 1). The Zener diode chip 36 is connected between the lead frame 11 and the lead frame 12. To put it specifically, a die mounting material 37 made of a conductive material such as solder or silver paste is attached to the upper surface of the lead frame 12, and the Zener diode chip 36 is placed on the die mounting material 37. Thereby, the Zener diode chip 36 is mounted on the lead frame 12 with the die mounting material 37 being interposed in between, and a lower surface terminal (not illustrated) of the Zener diode chip 36 is connected to the lead frame 12 with the die mounting material 37 being interposed in between. In addition, an upper surface terminal 36a of the Zener diode chip 36 is connected to the lead frame 11 through a wire 38. To put it specifically, an end of the wire 38 is connected to the upper surface terminal 36a of the Zener diode chip 36. The wire 38 is led out from the upper surface terminal 36a in the +Z direction, and is curved in a direction between the −Z direction and the −X direction. The other end of the wire 38 is bonded to the upper surface of the lead frame 11.

Thereby, this embodiment can connect the Zener diode chip 36 and the LED chip 14 in parallel. As a result, this embodiment enhances the resistance against ESD (Electrostatic Discharge). The configuration, manufacturing method, and operation/working-effects of this embodiment are the same as those of the first embodiment, except for what has been just described above.

Next, descriptions will be provided for a fourth embodiment.

Figure 13:
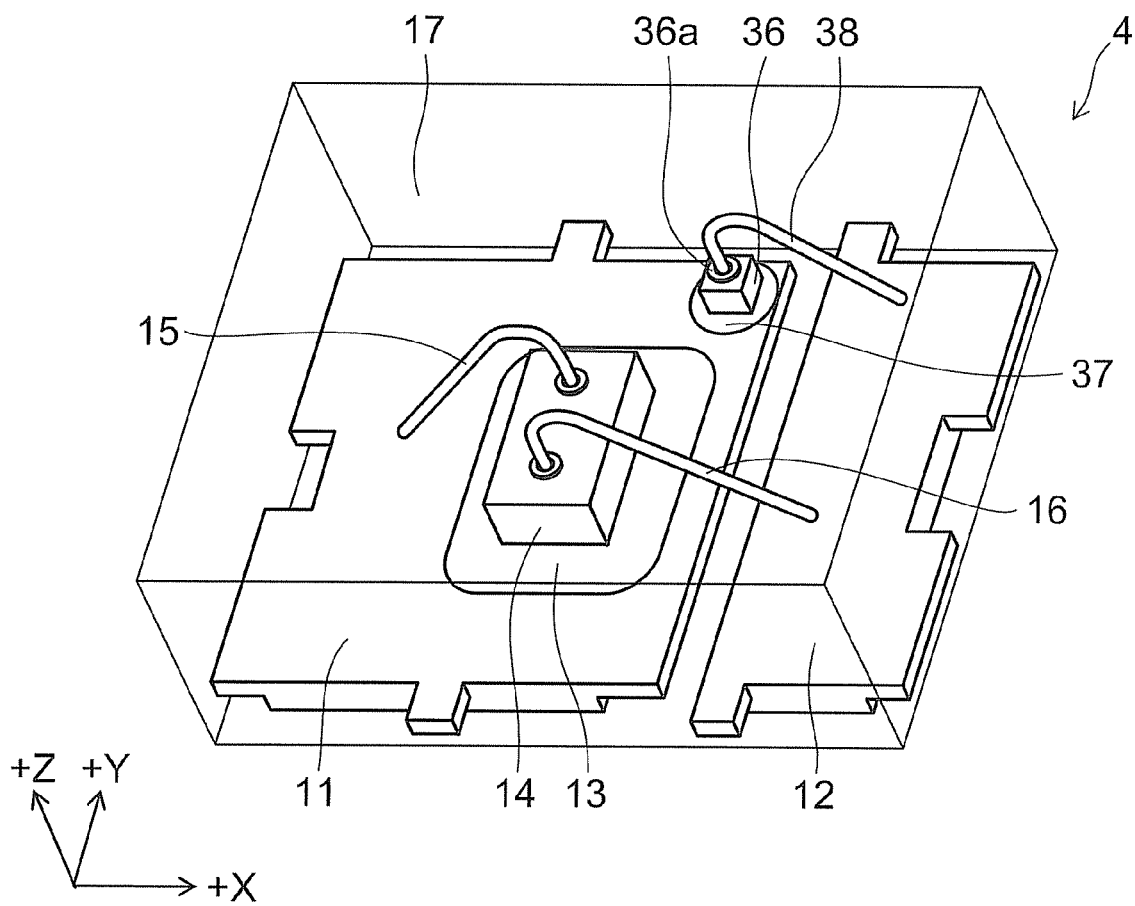
FIG. 13 is a perspective view illustrating an LED package according to a fourth embodiment.

FIG. 13 is a perspective view illustrating an LED package according to this embodiment.

Figure 14:
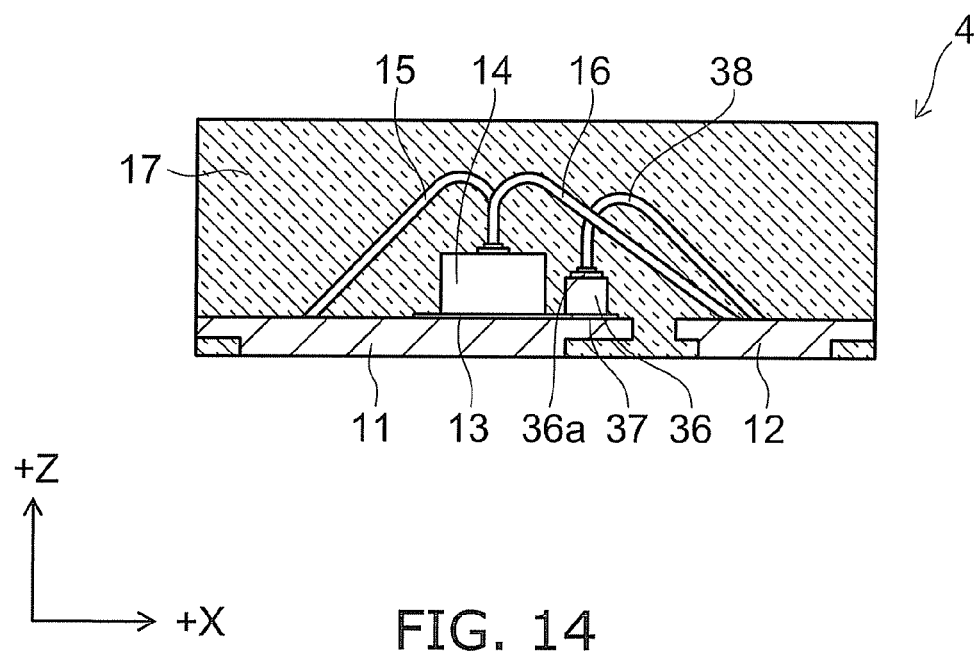
FIG. 14 is a cross-sectional view illustrating the LED package according to the fourth embodiment.

FIG. 14 is a cross-sectional view illustrating the LED package according to this embodiment.

As shown in FIGS. 13 and 14, the LED package 4 according to this embodiment is different from the LED package 3 according to the third embodiment (see FIG. 11) in that the Zener diode chip 36 is mounted on the lead frame 11. In this case, the lower surface terminal of the Zener diode chip 36 is connected to the lead frame 11 with the die mounting material 37 being interposed in between, and the upper surface terminal thereof is connected to the lead frame 12 through the wire 38. The configuration, manufacturing method, and operation/working-effects of this embodiment are the same as those of the third embodiment, except for what has been just described above.

Next, descriptions will be provided for a fifth embodiment.

Figure 15:
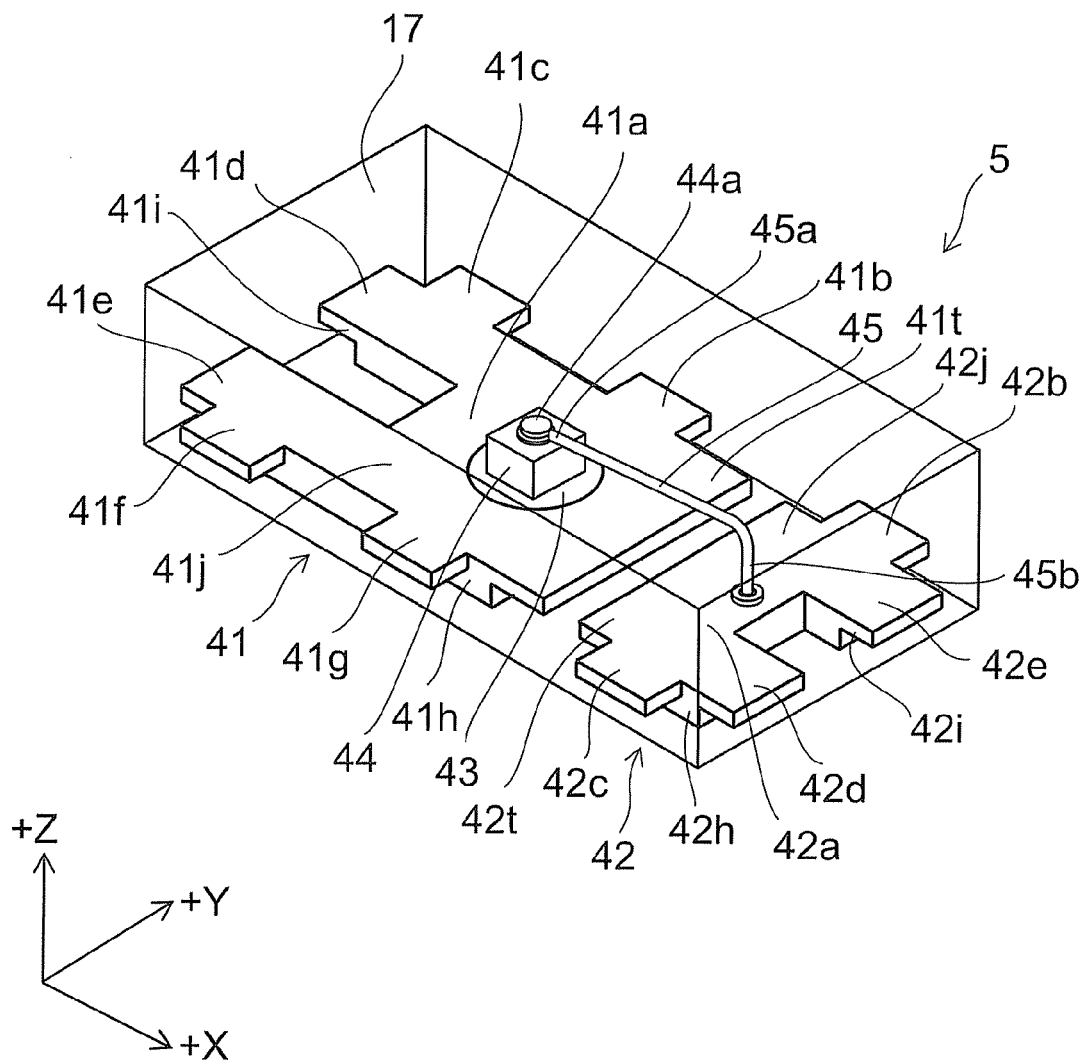
FIG. 15 is a perspective view illustrating an LED package according to a fifth embodiment.

FIG. 15 is a perspective view illustrating an LED package according to this embodiment.

Figure 16A:
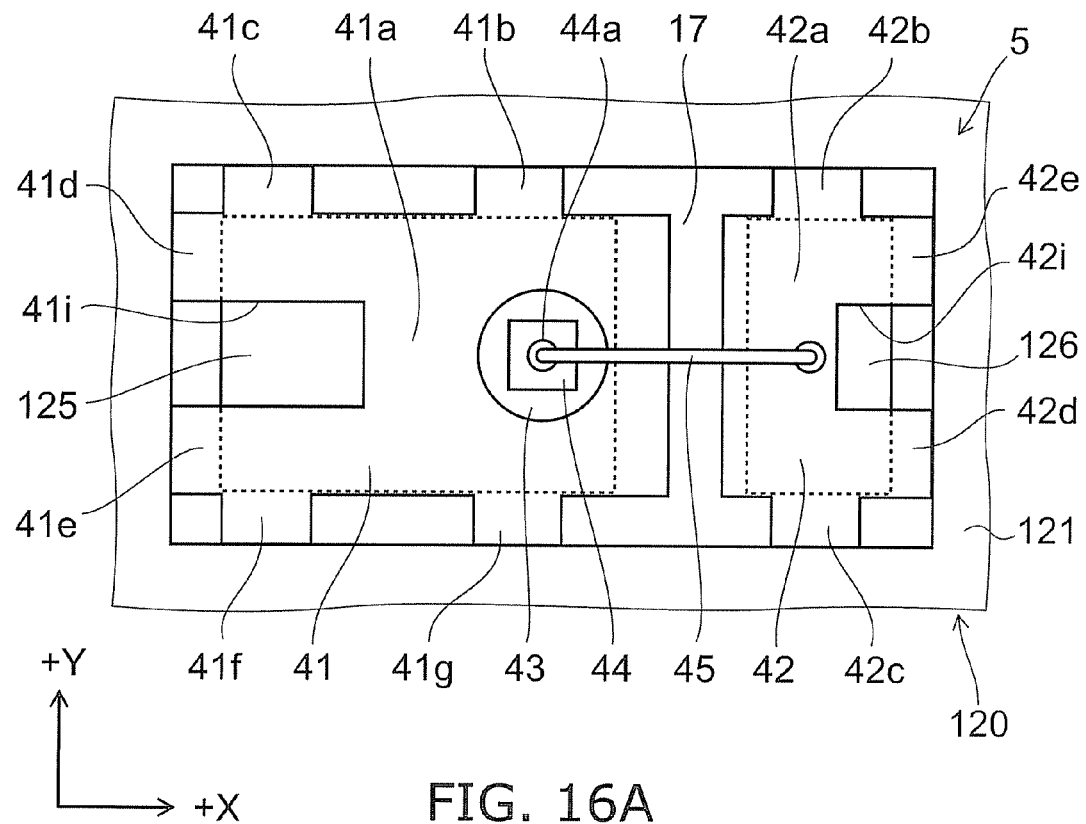
FIG. 16A is a plan view illustrating the LED package according to the fifth embodiment.
Figure 16B:
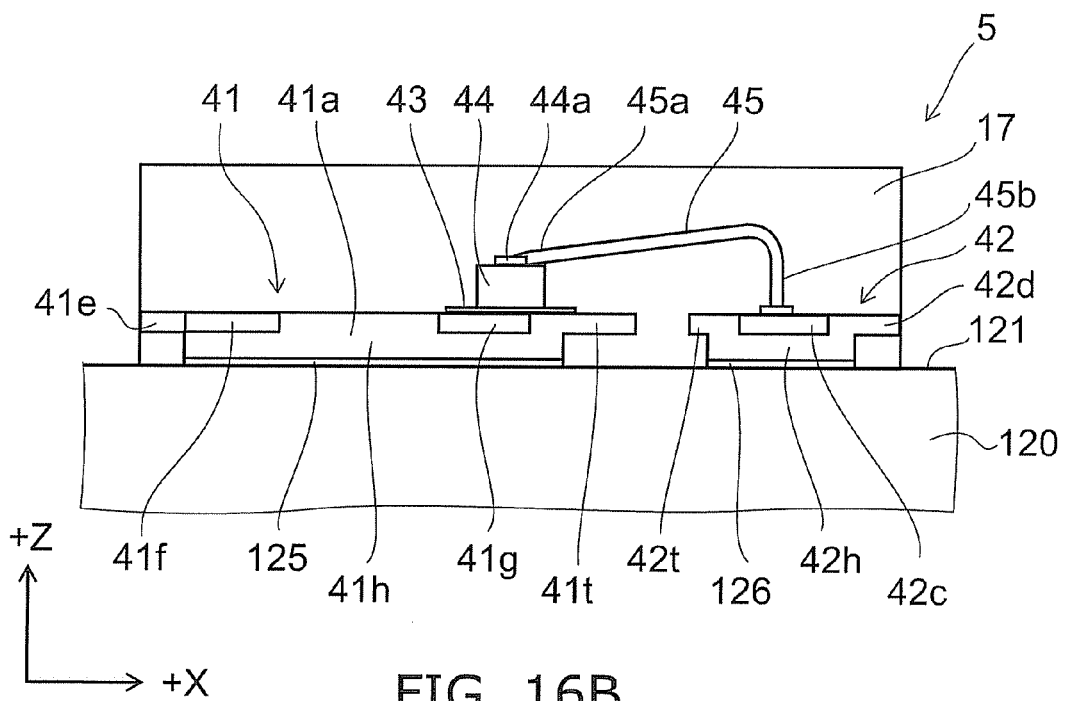
FIG. 16B is its side view.

FIG. 16A is a plan view illustrating the LED package according to this embodiment, and FIG. 16B is its side view.

As shown in FIG. 15 and FIGS. 16A and 16B, the LED package 5 according to this embodiment is different from the LED package 1 according to the first embodiment (see FIG. 1) in terms of the shape of the lead frame and the LED chip type.

To put it specifically, the LED package 5 includes paired lead frames 41, 42. The lead frame 42 is placed next to the lead frame 41 in the +X direction. In addition, the length of the lead frame 42 in the X direction is shorter than the length of the lead frame 41 in the X direction.

In the lead frame 41, six extending portions 41b to 41g extend from a base portion 41a. The extending portions 41b, 41c extend in the +Y direction from vicinities of the respective two end portions of an edge of the base portion 41a, the edge facing in the +Y direction. The extending portions 41d, 41e extend in the −X direction from the two end portions of an edge of the base portion 41a, the edge facing in the −X direction. The extending portions 41f, 41g extend in the −Y direction from vicinities of the respective two end portions of an edge of the base portion 41a, the edge facing in the −Y direction. In addition, a projected portion 41h is formed in a center portion of the lower surface of the base portion 41a in the X direction. On the other hand, a portion without formation of the projected portion 41h of the base portion 41a, i.e., the +X-direction end, is a thin plate portion 41t. Furthermore, a slit 41i entering the lead frame 41 in the +X direction is formed in an area of the lead frame 41 between the extending portions 41d, 41e. The slit 41i enter the projected portion 41h, and penetrates the lead frame 41 in the Z direction. Therefore, as viewed from below (−Z direction), the projected portion 4h has a particular shape. The particular shape includes a first approximately straight line, a second approximately straight line and a third approximately straight line, the first and second lines being approximately parallel, and the third line being approximately perpendicular to the first and second lines. The first and second lines have the approximately same length. One end of the third line is connected to one end of the first line, and another end of the third line is connected to one end of the second line. The first and second lines are located on the same side of the third line. That is, the slit 41i penetrating in the Z direction is formed in an exposed portion of the lower surface of the lead frame 41 from the transparent resin body 17.

In the lead frame 42, four extending portions 42b to 42e extend from a base portion 42a. The extending portion 42b extends in the +Y direction from an entire edge of the base portion 42a, the edge facing in the +Y direction. The extending portion 42c extends in the −Y direction from an entire edge of the base portion 42a, the edge facing in the −Y direction. The extending portions 42d, 42e extend in the +X direction from the two end portions of an edge of the base portion 42a, the edge facing in the +X direction. In addition, a projected portion 42h is formed in a center portion of the lower surface of the base portion 42a in the X direction. On the other hand, a portion without formation of the projected portion 42h of the base portion 42a, i.e., the −X-direction end, is a thin plate portion 42t. Furthermore, a slit 42i entering the lead frame 42 in the −X direction is formed in an area of the lead frame 42 between the extending portions 42d, 42e. The slit 42i enter the projected portion 42h, and penetrates the lead frame 42 in the Z direction. Therefore, as viewed in the −Z direction, the projected portion 42h has the above particular shape. That is, the slit 42i penetrating in the Z direction is formed in an exposed portion of the lower surface of the lead frame 42 from the transparent resin body 17.

From a viewpoint of the X direction, the location of the extending portion 41b and the location of the extending portion 41g coincide with each other, the location of the extending portion 41c and the location of the extending portion 41f coincide with each other, as well as the location of the extending portion 42b and the location of the extending portion 42c coincide with each other. Moreover, from a viewpoint of the Y direction, the location of the extending portion 41d and the location of the extending portion 42e coincide with each other, the location of the extending portion 41e and the location of the extending portion 42d coincide with each other, as well as the location of the slit 41i and the location of the slit 42i coincide with each other.

A die mounting material 43, which is conductive, is placed in an intermediate area between the extending portions 41b, 41g on an upper surface 41j of the lead frame 41. An LED chip 44 is mounted on the die mounting material 43. The LED chip 44 is a vertically-conductive chip. A lower surface terminal (not illustrated) is provided to the lower surface of the LED chip 44, and an upper surface terminal 44a is provided to the upper surface of the LED chip 44. The lower surface terminal of the LED chip 44 is connected to the lead frame 41 with the die mounting material 43 being interposed in between. On the other hand, the upper surface terminal 44a of the LED chip 44 is connected to the lead frame 42 through a wire 45. To put it specifically, an end portion 45a of the wire 45 is bonded to the upper surface terminal 44a of the LED chip 44, and the other end portion 45b is bonded to an intermediate area between the extending portions 42b, 42c on an upper surface 42j of the lead frame 42. Note that the die mounting material 43 is made of silver paste or metal solder, for instance; and the wire 45 is made of gold, for instance.

The end portion 45a of the wire 45 is led out from the upper surface terminal 44a almost horizontally (in the +X direction), and the end portion 45b of the wire 45 is led out from the upper surface 42j almost perpendicularly (in the +Z direction). To put it specifically, an angle between the upper surface 413 (the XY coordinate plane) of the lead frame 41 and the direction (almost equal to the +X direction) in which the wire 45 is led out from the upper surface terminal 44a is smaller than an angle between the upper surface 42j (the XY coordinate plane) of the lead frame 42 and the direction (almost equal to the +Z direction) in which the wire 45 is led out from the lead frame 42. In this embodiment, the bonding of the wire 45 is achieved by bonding the end portion 45b to the upper surface 42j of the lead frame 42 first; and bonding the end portion 45a to the upper surface terminal 44a of the LED chip 44 later. This realizes the above-mentioned large-small relationship in lead angle.

In this embodiment as well, similar to the above first embodiment, the transparent resin body 17 covers the lead frames 41 and 42, the die mount material 43, the LED chip 44 and the wire 45, and the appearance of the transparent resin body 17 forms a part of the appearance of the LED package 5. The lower surface of the projected portion 41*h* of the lead frame 41 and the lower surface of the projected portion 42*h* of the lead frame 42 are exposed on a region apart from each other in the lower surface of the transparent resin body 17, and the tip edge surface of each extending portion of the lead frames 41 and 42 is exposed on the side surface of the transparent resin body 17. The transparent resin body 17 enters inside the slits 41*i* and 42*i*.

Next, effects of this embodiment will be described.

As shown in FIGS. 16A and 16B, the LED package 5 according to this embodiment is mounted on a mounting board 120 to be used. In time of mounting, solder fillets 125 and 126 are formed in two rectangular regions apart from each other in a mounting surface 121 of the mounting board 120. Next, the Led package 5 is placed on the mounting surface 121. Here, the lower surface of the projected portion 41*h* of the lead frame 41 is placed in contact with the solder fillet 125, and the lower surface of the projected portion 42*h* of the lead frame 42 is placed in contact with the solder fillet 126. As viewed in the +Z direction, an outer edge of the projected portion 41*h* except for the slit 41*i* is coincided with an outer edge of the solder fillet 125, and an outer edge of the projected portion 42*h* except for the slit 42*i* is coincided with an outer edge of the solder fillet 126. Next, heat treatment is performed and the solder fillets 125 and 126 are melted once, and subsequently solidified. This causes the lead frame 41 to be bonded to the mounting board 120 via the solder fillet 125, and causes the lead frame 42 to be bonded to the mounting board 120 via the solder fillet 126. Consequently, the LED package 5 is mounted on the mounting board 120.

In this embodiment, since the slit 41*i* is formed in the lead frame 41, by observing the mounting surface 121 in the +Z direction via the transparent resin body 17 and the slit 41*i*, it can be inspected whether the solder fillet 125 exists or not, even after the LED package 5 is in contact with the mounting surface 121. Similarly, since the slit 42*i* is formed in the lead frame 42, by observing the mounting surface 121 in the +Z direction via the transparent resin body 17 and the slit 42*i*, it can be inspected whether the solder fillet 126 exists or not, even after the LED package 5 is in contact with the mounting surface 121. In particular, the transparent resin body 17 is made of transparent resin and does not contain phosphor, therefore visible light transmittance is high and the observation is easily performed. The transparent resin body 17 enters inside the slits 41*i* and 42*i*, and thereby adhesion of the lead frames 41 and 42 to the transparent resin body 17 becomes excellent and durability of the LED package 5 is improved.

Furthermore, in this embodiment, the angle between the upper surface of the lead frame 41 and the direction in which the wire 45 is led out from the upper surface terminal 44*a* is set smaller than the angle between the upper surface of the lead frame 42 and the direction in which the wire 45 is led out from the lead frame 42. This makes it possible to inhibit the height of the loop of the wire 54, and accordingly to make the overall thickness of the LED package 5 thinner. Furthermore, the employment of the vertically-conductive LED chip 44 and only a single wire securely prevents the wire from being in contact with any other wire, and concurrently simplifies the wire bonding process. The configuration, manufacturing method, and operation/working-effects of this embodiment are the same as those of the first embodiment, except for what has been just described above.

Here, in this embodiment, forming the slits 41*i* and 42*i* in the lead frames 41 and 42, respectively is exemplified, however a window penetrating in the Z direction may be formed inside each lead frame. Thereby, it can be inspected whether the solder fillet exists or not through the window and the adhesion to the transparent resin body is improved.

Next, descriptions will be provided for a sixth embodiment.

Figure 17:
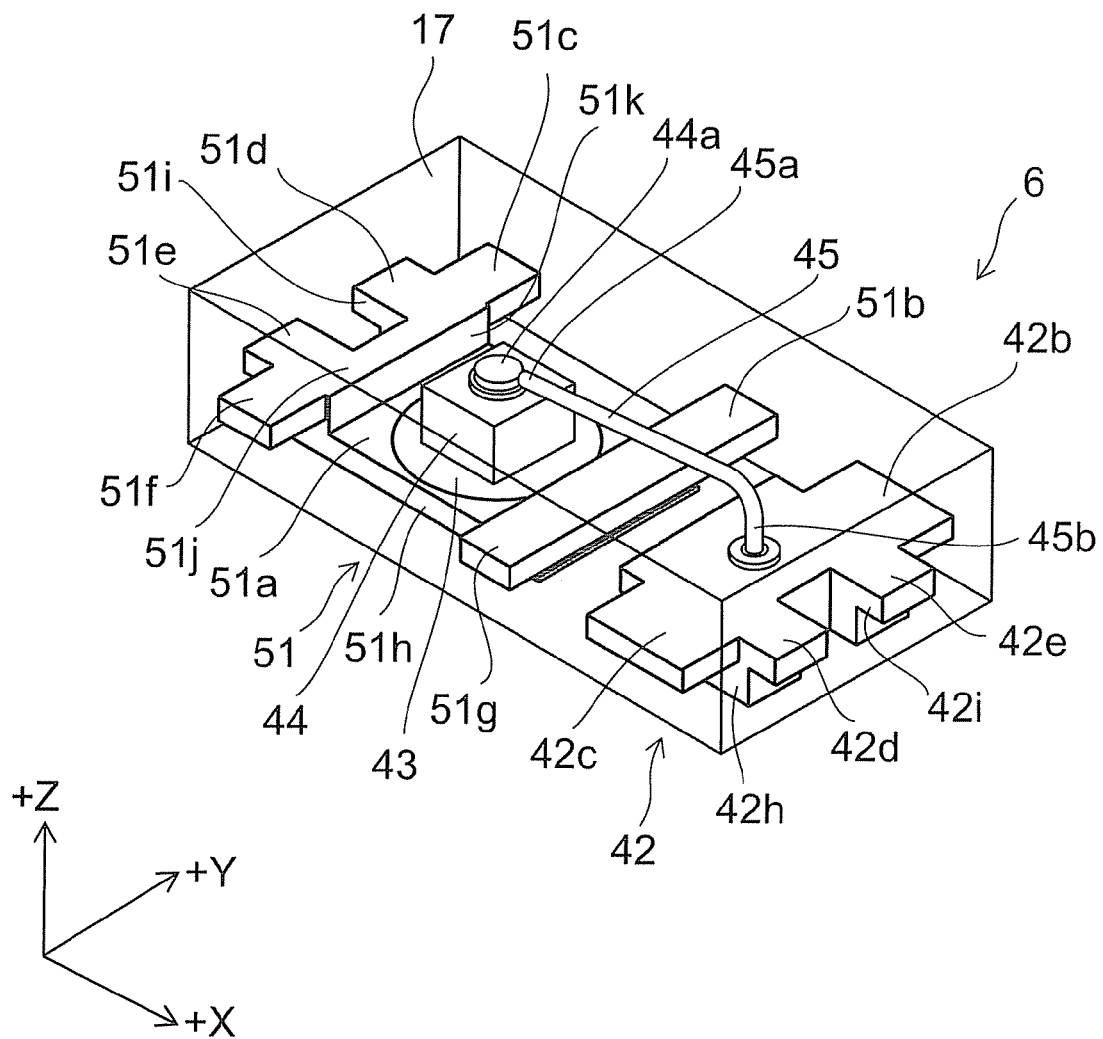
FIG. 17 is a perspective view illustrating an LED package according to a sixth embodiment.

FIG. 17 is a perspective view illustrating an LED package according to this embodiment.

As shown in FIG. 17, the LED package 6 according to this embodiment is different from the LED package 5 according to the fifth embodiment (see FIG. 15) in terms of the shape of the lead frame on which the LED chip is mounted.

To put it specifically, the LED package 6 according to this embodiment includes a lead frame 51 instead of the lead frame 41 (see FIG. 15). In the lead frame 51, an area in an upper surface 51*j*, which corresponds to a center portion of a base portion 51*a* in the X direction, is lower than the rest in the upper surface 51*j*. In other words, a recessed portion 51*k* is formed in a center portion, in the X direction, of the upper surface 513 of the lead frame 51, and the LED chip 44 is placed in the inside of the recessed portion 51*k*.

This embodiment makes it possible to further reduce the height of the LED package because of: the formation of the recessed portion 51*k* in the lead frame 51; and the placement of the LED chip 44 in the inside of the recessed portion 51*k*. The configuration, manufacturing method, and operation/working-effects of this embodiment are the same as those of the fifth embodiment, except for what has been just described above.

Next, descriptions will be provided for a seventh embodiment.

Figure 18:
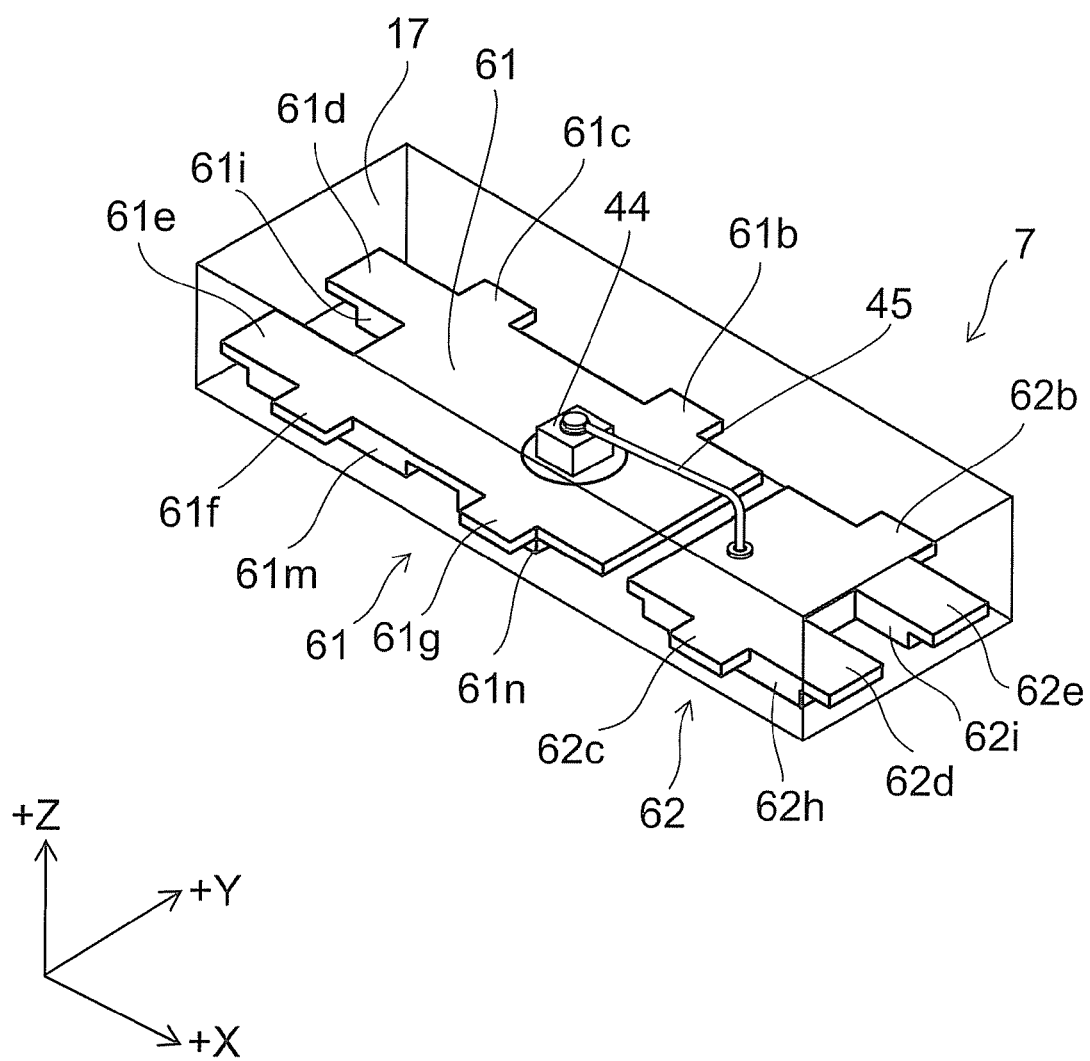
FIG. 18 is a perspective view illustrating an LED package according to a seventh embodiment.

FIG. 18 is a perspective view illustrating an LED package according to this embodiment.

Figure 19A:
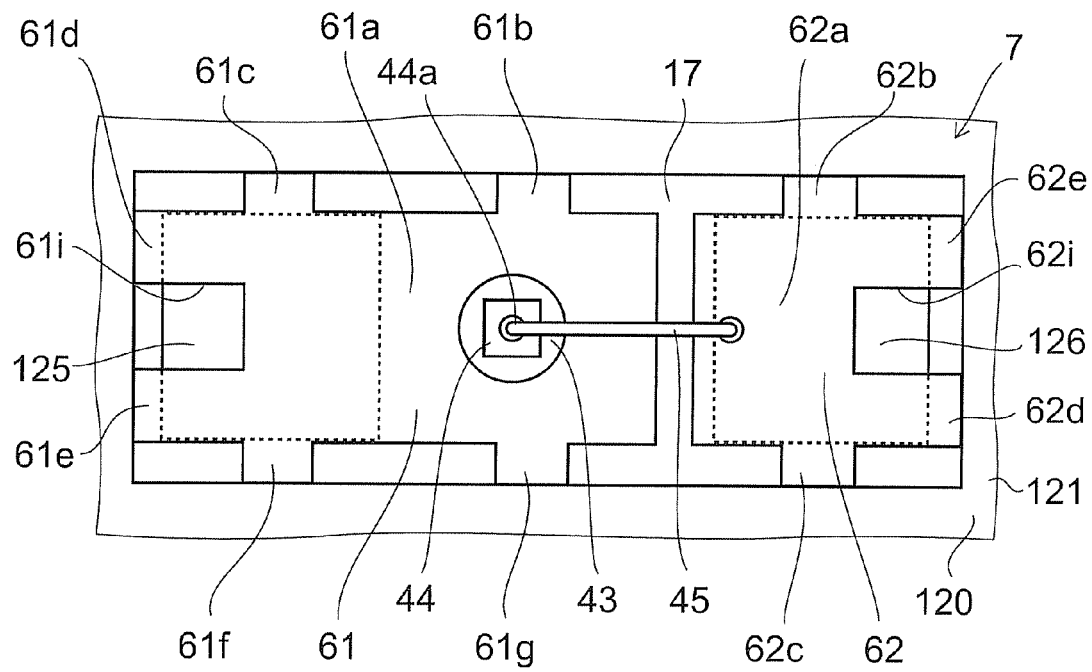
FIG. 19A is a plan view illustrating the LED package according to the seventh embodiment.
Figure 19B:
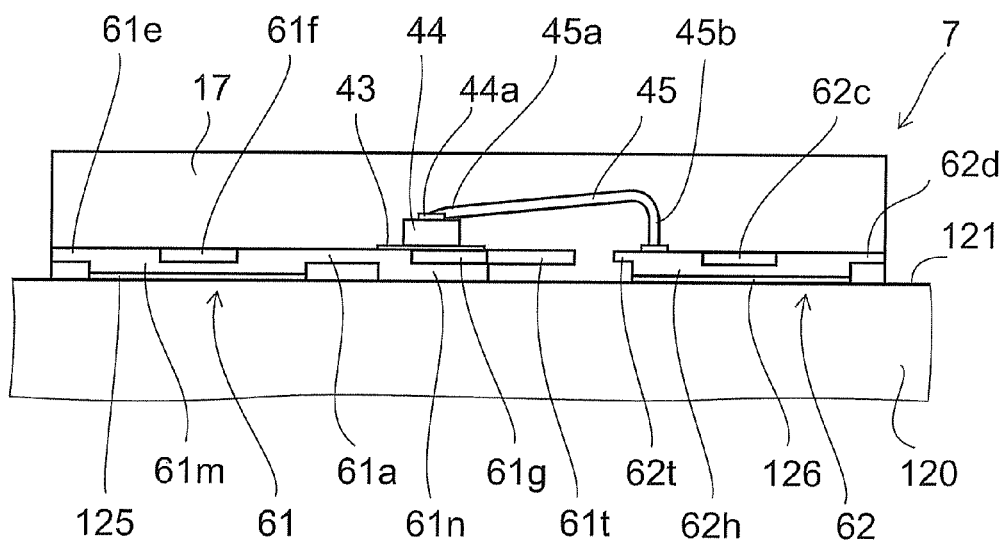
FIG. 19B is its side view.

FIG. 19A is a plan view illustrating the LED package according to this embodiment, and FIG. 19B is its side view.

As shown in FIG. 18 and FIGS. 19A and 19B, the LED package 7 according to this embodiment is different from the LED package 5 according to the fifth embodiment (see FIG. 15) in terms of the shape of the lead frame on which the LED chip is mounted.

To put it specifically, from the viewpoint of the X direction, the length of a lead frame 61 on which the LED chip 44 is mounted in the LED package 7 according to this embodiment is longer than the length of the lead frame 41 according to the fifth embodiment (see FIG. 15). In addition, two projected portions 61*m*, 61*n*, which are isolated from each other in the X direction, are formed on the lower surface of the lead frame 61. The projected portion 61*m* is situated next to the projected portion 61*n* in the −X direction. Furthermore, from the viewpoint of the X direction, the length of a lead frame 62 on which no LED chip 44 is mounted is longer than the length of the lead frame 42 according to the sixth embodiment as well. Note that the number of projected portions 62*h* formed on the lower surface of the lead frame 62 is one.

A slit 61*i* that enters in the +X direction is formed in a region between an extending portion 61*d* and an extending portion 61*e* of the lead frame 61. As viewed in the −Z direction, a tip edge of the slit 61*i* is located inside the projected portion 61*m*. Similarly, a slit 62*i* that enters in the −X direction is formed in a region between an extending portion 62*d* and an extending portion 62*e* of the lead frame 62. As viewed in the −Z direction, a tip edge of the slit 62*i* is located inside the projected portion 62*h*. Therefore, as viewed from below (−Z direction), the projected portions 61m and 62h have the particular shape previously described. The shape and size of the projected portion 61m are the same as the shape and size of the projected portion 62h, and the projected portions 61m, 62h are symmetrical with respect to the YZ coordinate plane. The projected portions 61m, 62h function as external electrode pads of the LED package 7.

In this embodiment, the lower surfaces of the projected portions 61m, 62h, which are used as the external electrode pads, are the same in terms of the shape and size. Therefore, in time of mounting the LED package 7 on the mounting board 120, the shape and size of the solder fillet 125 can be the same as the shape and size of the solder fillet 126. This makes it possible to prevent the Manhattan phenomenon. Moreover, similar to the above fifth embodiment, in time of mounting the LED package 7 on the mounting board 120, it can be inspected whether the solder fillets 125 and 126 exist or not through the slits 61i and 62i. Furthermore, since the transparent resin body 17 enters the slits 61i and 62i, adhesion of the lead frames 61 and 62 to the transparent resin body 17 becomes excellent. The configuration, manufacturing method, and operation/working-effects of this embodiment are the same as those of the fifth embodiment, except for what has been just described above.

Next, descriptions will be provided for an eighth embodiment.

Figure 20:
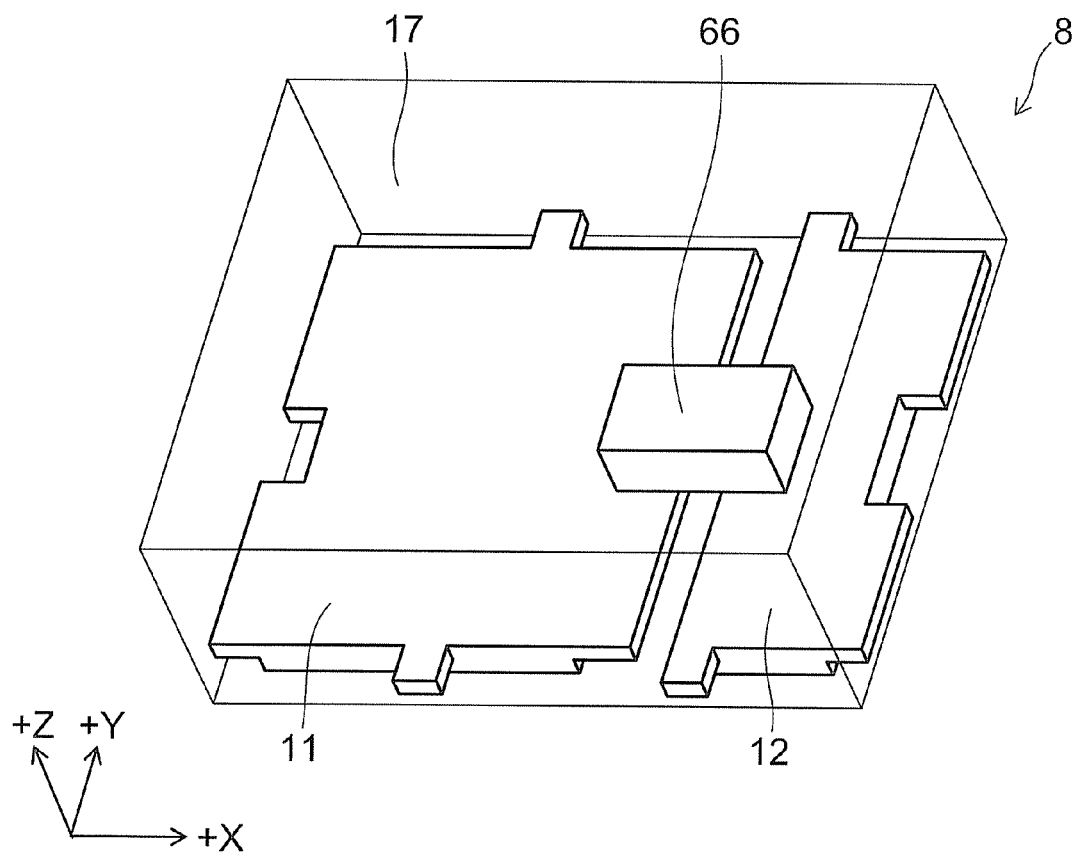
FIG. 20 is a perspective view illustrating an LED package according to an eighth embodiment.

FIG. 20 is a perspective view illustrating an LED package according to this embodiment.

Figure 21:
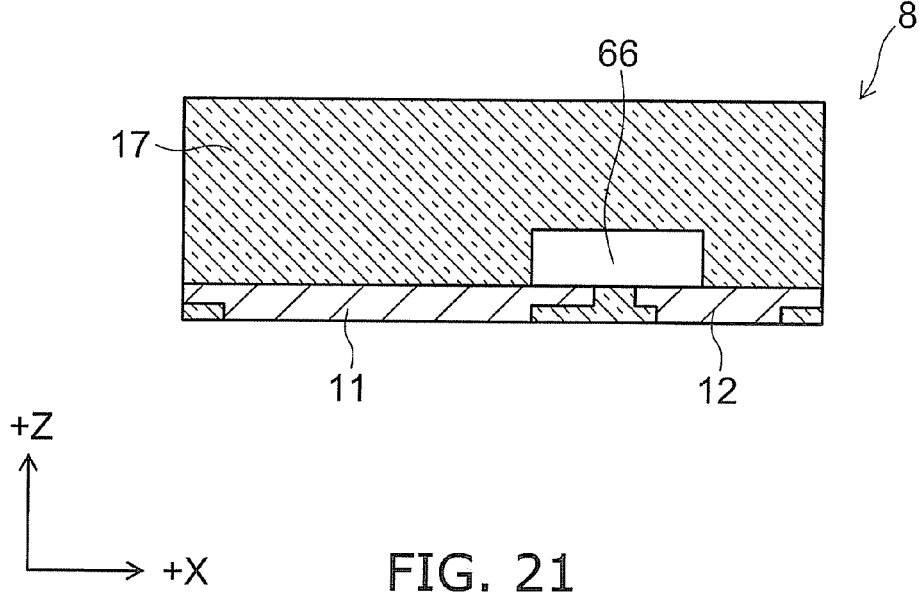
FIG. 21 is a cross-sectional view illustrating the LED package according to the eighth embodiment.

FIG. 21 is a cross-sectional view illustrating the LED package according to this embodiment.

As shown in FIGS. 20 and 21, the LED package 8 according to this embodiment is different from the LED package 1 according to the first embodiment (see FIG. 1) in that the LED package 8 includes a flip LED chip 66 instead of the LED chip 14 of a type having the upper surface terminal. To put it specifically, in the LED package 8 according to this embodiment, the LED chip 66 has two terminals on its lower surface. In addition, the LED chip 66 is placed, like a bridge, over a gap between the lead frame 11 and the lead frame 12. One lower surface terminal of the LED chip 66 is connected to the lead frame 11, and the other lower surface terminal of the LED chip 66 is connected to the lead frame 12.

In this embodiment, the elimination of wires in exchange for the employment of the flip LED chip 66 makes it possible to enhance the efficiency of extracting light upward, and concurrently to eliminate the wire bonding process. In addition, this further reduces the height of the LED package, and also prevents wires from breaking due to thermal stress of the transparent resin body 17 as well. The configuration, manufacturing method, and operation/working-effects of this embodiment are the same as those of the first embodiment, except for what has been just described above.

Next, descriptions will be provided for a ninth embodiment.

Figure 22:
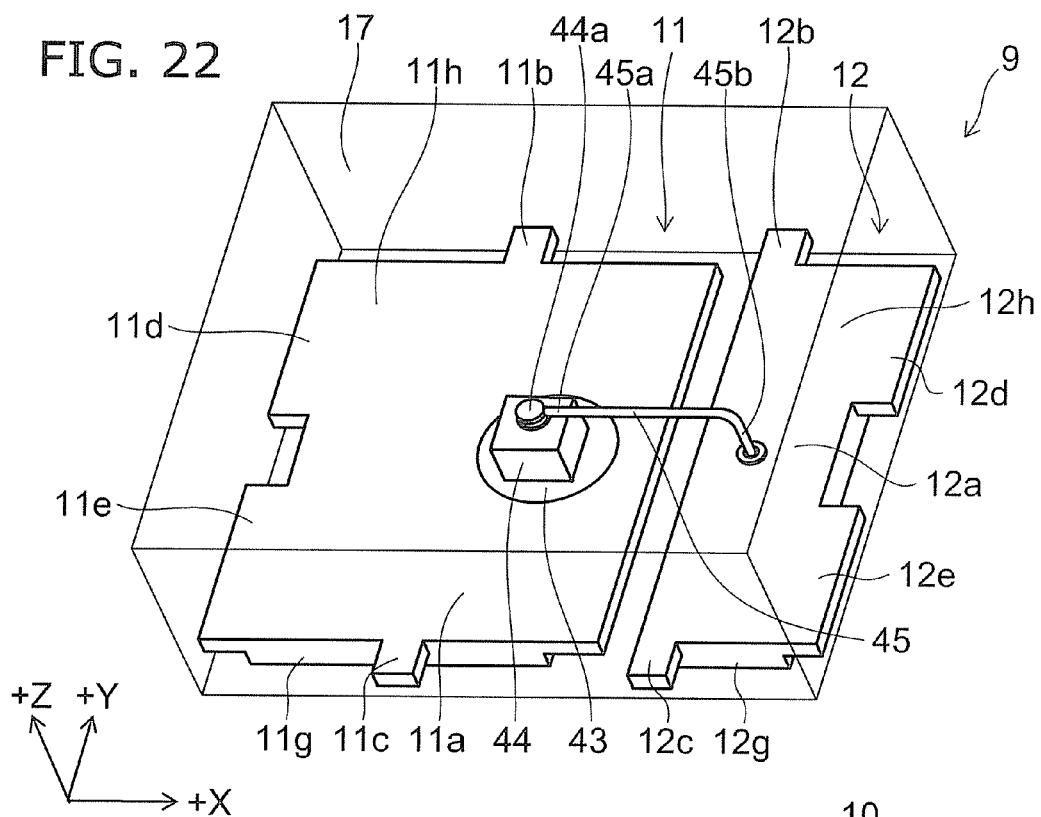
FIG. 22 is a perspective view illustrating an LED package according to a ninth embodiment.

FIG. 22 is a perspective view illustrating an LED package according to this embodiment.

As shown in FIG. 22, this embodiment is a combination of the first embodiment and the fifth embodiment. To put it specifically, the LED package 9 according to this embodiment includes the lead frames 11, 12, which have been described in connection with the first embodiment (see FIG. 1). In addition, the vertically-conductive LED chip 44, which has been described in connection with the fifth embodiment (see FIG. 15), is mounted on this lead frame 11. The lower surface terminal of the LED chip 44 is connected to the lead frame 11 with the die mounting material 43 being interposed in between, and the upper surface terminal 44a of the LED chip 44 is connected to the lead frame 12 through the wire 45.

Furthermore, as in the fifth embodiment, the end portion 45a of the wire 45 is led out from the upper surface terminal 44a almost horizontally (in the +X direction), and the end portion 45b of the wire 45 is led out from the upper surface of the lead frame 12 almost perpendicularly (in the +Z direction). To put it specifically, an angle between the upper surface (the XY coordinate plane) of the lead frame 11 and the direction (almost equal to the +X direction) in which the wire 45 is led out from the upper surface terminal 44a is smaller than an angle between the upper surface (the XY coordinate plane) of the lead frame 12 and the direction (almost equal to the +Z direction) in which the wire 45 is led out from the lead frame 12.

Like the fifth embodiment, this embodiment makes it possible to inhibit the height of the loop of the wire 45, and accordingly to make the overall thickness of the LED package 9 thinner as well. In addition, the employment of the vertically-conductive LED chip 44 and only a single wire securely prevents the wire from being in contact with any other wire, and concurrently to simplify the wire bonding process. The configuration, manufacturing method, and operation/working-effects of this embodiment are the same as those of the first embodiment, except for what has been just described above.

Next, descriptions will be provided for a tenth embodiment.

Figure 23:
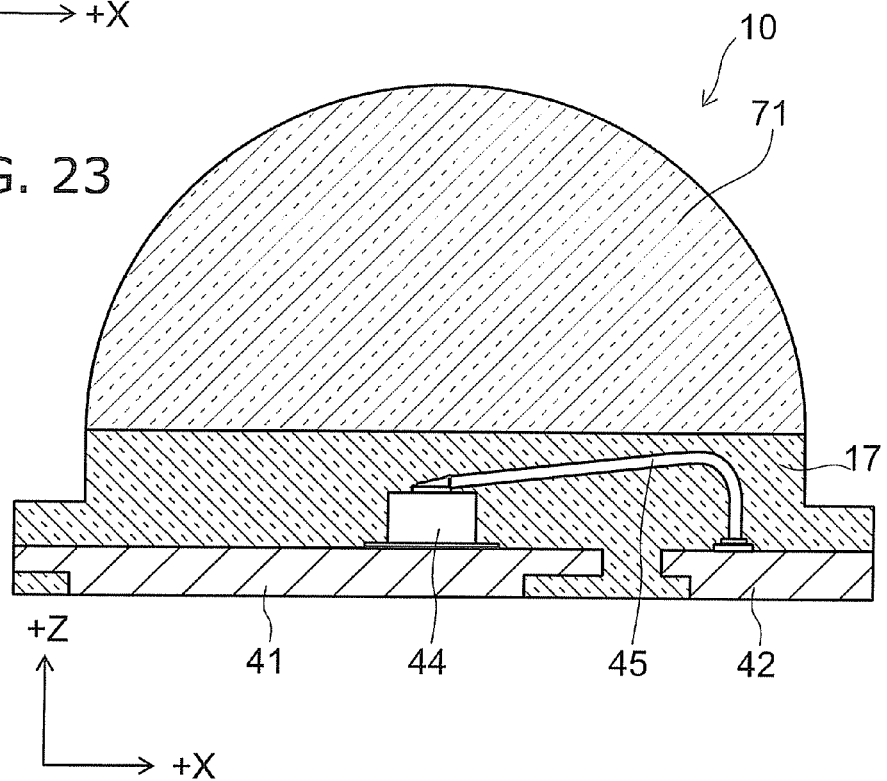
FIG. 23 is a cross-sectional view illustrating an LED package according to a tenth embodiment.

FIG. 23 is a cross-sectional view illustrating an LED package according to this embodiment.

Figure 6B:
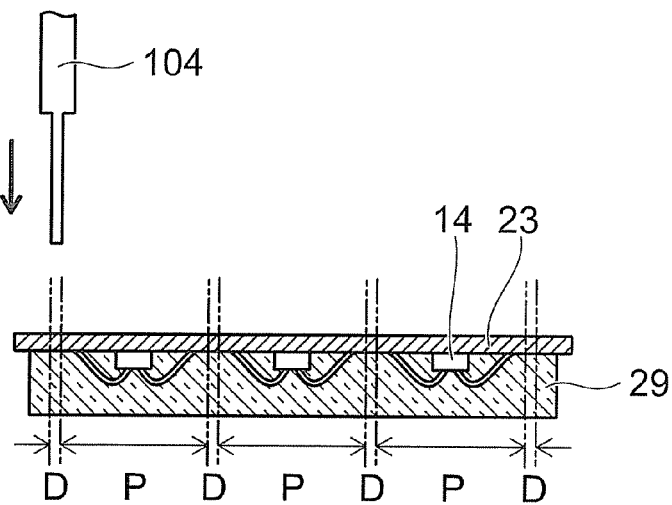

As shown in FIG. 23, the LED package 10 according to this embodiment includes a lens 71, which is placed on the transparent resin body 17, in addition to the configuration of the LED package 5 according to the fifth embodiment (see FIG. 15). The lens 71 is made of a transparent resin, and is a plano-convex lens whose convexity is directed upward. The lens 71, for example, may be unitarily formed with the transparent resin body 17 by forming a concave part in the bottom surface of the lower die 101 (see FIG. 5). Otherwise, the lens 71 may come with each of the transparent resin bodies 17 into which the transparent plate 29 (see FIG. 6) is diced after the lenses 71 are attached to the transparent plate 29 having been beforehand formed. Alternatively, the lens 71 may be attached to each of the transparent resin bodies 17 into which the transparent resin plate 29 is diced. This embodiment enables light outgoing from the transparent resin body 17 to be converged in the upright direction (in the +Z direction) by the lens 71, and accordingly enhances the orientation. The configuration, manufacturing method, and operation/working-effects of this embodiment are the same as those of the fifth embodiment, except for what has been just described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

For instance, although the forming of the lead frame sheet 23 by wet-etching has been shown as an example of the first embodiment, the invention is not limited to this case. The lead frame sheet 23 may be formed, for instance, by a mechanical instrument such as a press. Furthermore, although the mounting of one LED chip in one LED package has been shown as an example of each foregoing embodiment, the invention is not limited to this case. Multiple LED chips may be mounted on one LED package. Moreover, a groove may be formed on the upper surface of the lead frame between an area in which the die mounting material is to be formed and an area to which the wire is to be bonded. Otherwise, a recessed portion may be formed in an area in which the die mounting material is to be formed on the upper surface of the lead frame. This prevents the die mounting material from flowing and reaching an area to which the wire is to be bonded, and accordingly to prevent the die mounting material from obstructing the wire bonding, regardless of deviation in the amount of supplied die mounting material and the position to which the die mounting material is supplied. In addition, the transparent resin body 17 may contain a fluorescent material.

Furthermore, although the forming of the silver plated layers on the respective upper and lower surfaces of the copper plate in each lead frame has been shown as an example of the first embodiment, the invention is not limited to this case. For instance, a rhodium (Rh) plated layer may be formed on at least one of the silver plated layers formed on the respective upper and lower surfaces of the copper plate. Moreover, a copper (Cu) plated layer may be formed between the copper plate and each silver plated layer. Otherwise, nickel (Ni) plated layers may be formed on the respective upper and lower surfaces of the copper plate, followed by forming a gold-silver alloy (Au—Ag alloy) plated layer on each of the nickel plated layers.

In addition, although the base portion of each lead frame which has a rectangular shape when viewed from the above has been shown as an example of each foregoing embodiment and the variation, the base portion may instead have a shape which is obtained by cutting off at least one corner portion from the rectangle. By this, right angle or acute angle portion is removed from the corner portion and its vicinity of the LED package. For this reason, the chamfered portion no longer provides a starting point at which the resin starts to come off or crack. Consequently, it is possible to inhibit the resin from coming off and cracking in the LED package as a whole.

The above-described embodiments can provide the highly-durable LED package which costs less, and the method of manufacturing the same.

The invention claimed is:
1. An LED package comprising:
a first lead frame and a second lead frame being apart from each other;
an LED chip provided above the first and second lead frames, the LED chip including a semiconductor layer which contains at least indium, gallium and aluminum, one terminal being connected to the first lead frame, and another terminal being connected to the second lead frame; and
a transparent resin body covering the LED chip and an entire upper surface, a part of a lower surface, and parts of edge surfaces of each of the first and second lead frames, and exposing a rest of the lower surface and a rest of the edge surfaces, the transparent resin body being formed of a single transparent resin material,
each of the first and second lead frames including:
a base portion, edge surfaces of the base portion being covered with the transparent resin body; and
a plurality of extending portions extending from the base portion in different directions, and having lower surfaces covered with the transparent resin body and tip edge surfaces exposed on side surfaces of the transparent resin body,
the first lead frame having a first edge and the second lead frame having a second edge, the first edge and the second edge facing each other,
the base portion of the first lead frame including:
a first projected portion being formed in a region being apart from the first edge, a lower surface of the first projected portion being exposed on a lower surface of the transparent resin body, and side surfaces of the first projected portion being covered with the transparent resin body; and
a first thin plate portion including the first edge, the first thin plate portion being thinner than the first projected portion, a lower surface of the first thin plate portion being covered with the transparent resin body,
the base portion of the second lead frame including:
a second projected portion being formed in a region being apart from the second edge, a lower surface of the second projected portion being exposed on the lower surface of the transparent resin body, and side surfaces of the second projected portion being covered with the transparent resin body; and
a second thin plate portion including the second edge, the second thin plate portion being thinner than the second projected portion, a lower surface of the second thin plate portion being covered with the transparent resin body,
a first slit being formed into the first projected portion between two of the extending portions, the first slit advancing toward a direction going to the second lead frame from the first lead frame, and penetrating vertically the first projected portion of the first lead frame, a shape of the lower surface of the first projected portion being U-shape,
a second slit being formed into the second projected portion between two of the extending portions, the second slit advancing toward a direction going to the first lead frame from the second lead frame, and penetrating vertically the second projected portion of the second lead frame, a shape of the lower surface of the second projected portion being U-shape, and
an appearance of the transparent resin body being a part of an appearance of the LED package.
2. The package according to claim 1, wherein the resin body is made of one resin selected from the group of epoxy resins, acrylic resins and urethane resins.
3. The package according to claim 1, wherein a recessed portion is formed in the upper surface of the first lead frame, and the LED chip is mounted inside the recessed portion.
4. The package according to claim 1, wherein the lower surface of the first projected portion has a shape equal to a shape of the lower surface of the second projected portion.
5. The package according to claim 1, wherein the LED chip is mounted on the first lead frame, the one terminal is provided on a lower surface of the LED chip, and the another terminal is provided on an upper surface of the LED chip, the package further comprising:
a die mounting material made of a conductive material, the die mounting material adhering the LED chip to the first lead frame, and connecting the one terminal to the first lead frame; and a wire connecting the another terminal to the second lead frame.

6. The package according to claim 5, wherein an angle between the upper surface of the first lead frame and a direction in which the wire is led out from the another terminal is set small than an angle between the upper surface of the second lead frame and a direction in which the wire is led out from the second lead frame.

7. The package according to claim 1, further comprising a lens provided on the resin body.

8. The package according to claim 1, wherein
the resin body has a rectangular shape when viewed from above, and
at least one of the first and second lead frames includes:
- a base portion having edge surfaces covered with the resin body; and
- a plurality of extending portions extending from the base portion, and having lower surfaces covered with the resin body and edge surfaces exposed on three different side surfaces of the resin body.

\* \* \* \* \*